US010161986B2

(12) United States Patent
Schweitzer, III et al.

(10) Patent No.: US 10,161,986 B2
(45) Date of Patent: Dec. 25, 2018

(54) ELECTRIC POWER SYSTEM MONITORING USING DISTRIBUTED CONDUCTOR-MOUNTED DEVICES

(71) Applicant: Schweitzer Engineering Laboratories, Inc., Pullman, WA (US)

(72) Inventors: Edmund O. Schweitzer, III, Pullman, WA (US); Shankar V. Achanta, Pullman, WA (US); David E. Whitehead, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 15/783,965

(22) Filed: Oct. 13, 2017

(65) Prior Publication Data
US 2018/0106851 A1    Apr. 19, 2018

Related U.S. Application Data

(60) Provisional application No. 62/408,868, filed on Oct. 17, 2016.

(51) Int. Cl.
*H02M 1/00* (2006.01)
*G01R 31/08* (2006.01)
(Continued)

(52) U.S. Cl.
CPC ......... *G01R 31/086* (2013.01); *G01R 31/024* (2013.01); *H04L 29/02* (2013.01);
(Continued)

(58) Field of Classification Search
CPC ... H02M 1/00; G01R 1/00; H02J 1/00; G06Q 10/00; H04L 1/00; H04L 2201/00
See application file for complete search history.

(56) References Cited

U.S. PATENT DOCUMENTS 4,138,664 A    2/1979 Conforti
4,297,738 A    10/1981 Lee
(Continued)

FOREIGN PATENT DOCUMENTS

EP        307826        3/1992
WO    2001022104    3/2001
WO    2006044354    4/2006

OTHER PUBLICATIONS

S&C Electric Company, S&C Intellirupter PulseCloser Specifications, Dec. 18, 2006.
(Continued)

*Primary Examiner* — Jermele M Hollington
*Assistant Examiner* — Temilade Rhodes-Vivour
(74) *Attorney, Agent, or Firm* — Jared L. Cherry; Bradley W. Schield

(57) ABSTRACT

Disclosed herein are systems for monitoring and protecting an electric power system using a plurality of conductor-mounted detectors (CMDs). In one embodiment, a plurality of CMDs are coupled to an electrical conductor. Each CMD may harvest power from the electrical conductor and may monitor electrical current in the conductor. When the electrical current in the conductor exceeds a fault current threshold a fault signal may be transmitted. A receiver in communication with each of the plurality of CMDs may receive the fault signal from at least one of the plurality of CMDs. A protective action may be generated and implemented to clear the fault. A portion of the electric power system affected by the fault may be determined based on identification of each of the plurality of CMDs to transmit the fault signal.

25 Claims, 13 Drawing Sheets

(51) Int. Cl.
*G01R 31/02* (2006.01)
*H04L 29/02* (2006.01)
*H04L 1/00* (2006.01)
*G01R 1/00* (2006.01)
*H02J 1/00* (2006.01)

(52) U.S. Cl.
CPC .................. *G01R 1/00* (2013.01); *H02J 1/00* (2013.01); *H04L 1/00* (2013.01)

(56) References Cited

U.S. PATENT DOCUMENTS

| | | | |
|---|---|---|---|
| 4,297,740 A | 10/1981 | Hagberg | |
| 4,297,783 A | 11/1981 | Casey, Jr. | |
| 4,313,146 A | 1/1982 | Lee | |
| 4,347,542 A | 8/1982 | Calhoun | |
| 4,357,644 A | 11/1982 | Schmidt | |
| 4,367,422 A | 1/1983 | Leslie | |
| 4,402,028 A | 8/1983 | Udren | |
| 4,466,071 A | 8/1984 | Henneberry | |
| 4,562,550 A | 12/1985 | Beatty | |
| 4,728,866 A | 3/1988 | Capewell | |
| 4,736,432 A | 4/1988 | Cantrell | |
| 4,811,210 A | 3/1989 | McAulay | |
| 4,834,485 A | 5/1989 | Lee | |
| 4,851,782 A | 7/1989 | Jeerings | |
| 4,871,971 A | 10/1989 | Jeerings | |
| 4,878,142 A | 10/1989 | Bergman | |
| 4,939,516 A | 7/1990 | Early | |
| 5,139,745 A | 8/1992 | Barr | |
| 5,168,414 A | 12/1992 | Horstmann | |
| 5,303,112 A | 4/1994 | Zulaski | |
| 5,341,265 A | 8/1994 | Westrom | |
| 5,452,223 A | 9/1995 | Zuercher | |
| 5,475,556 A | 12/1995 | Yoon | |
| 5,485,093 A | 1/1996 | Russell | |
| 5,506,789 A | 4/1996 | Russell | |
| 5,512,832 A | 4/1996 | Russell | |
| 5,521,946 A | 5/1996 | Main | |
| 5,537,327 A | 7/1996 | Snow | |
| 5,550,476 A | 8/1996 | Lau | |
| 5,550,751 A | 8/1996 | Russell | |
| 5,561,605 A | 10/1996 | Zuercher | |
| 5,565,783 A | 10/1996 | Lau | |
| 5,578,931 A | 11/1996 | Russell | |
| 5,600,526 A | 2/1997 | Russell | |
| 5,602,709 A | 2/1997 | Al-Dabbagh | |
| 5,648,726 A | 7/1997 | Le | |
| 5,656,931 A | 8/1997 | Lau | |
| 5,659,300 A | 8/1997 | Dresselhuys | |
| 5,659,453 A | 8/1997 | Russell | |
| 5,677,623 A | 10/1997 | Schweitzer | |
| 5,677,678 A | 10/1997 | Schweitzer | |
| 5,724,247 A | 3/1998 | Dalstein | |
| 5,734,575 A | 3/1998 | Snow | |
| 5,787,126 A | 7/1998 | Itch | |
| 5,835,321 A | 11/1998 | Elms | |
| 5,847,913 A | 12/1998 | Turner | |
| 5,889,399 A | 3/1999 | Schweitzer | |
| 5,896,302 A | 4/1999 | Goodpaster | |
| 6,002,260 A | 12/1999 | Lau | |
| 6,002,561 A | 12/1999 | Dougherty | |
| 6,014,301 A | 1/2000 | Schweitzer | |
| 6,016,105 A | 1/2000 | Schweitzer | |
| 6,058,353 A | 5/2000 | Goodpaster | |
| 6,195,241 B1 | 2/2001 | Brooks | |
| 6,287,357 B1 | 8/2001 | Croushore | |
| 6,292,340 B1 | 9/2001 | O'Regan | |
| 6,414,829 B1 | 7/2002 | Haun | |
| 6,453,248 B1 | 9/2002 | Hart | |
| 6,459,998 B1 | 10/2002 | Hoffman | |
| 6,483,680 B1 | 11/2002 | Kulidjian | |
| 6,654,216 B2 | 11/2003 | Horvath | |
| 6,687,110 B2 | 2/2004 | Murray | |
| 6,687,573 B2 | 2/2004 | Egolf | |
| 6,812,715 B2 | 11/2004 | Chiozzi | |
| 6,822,576 B1 | 11/2004 | Feight | |
| 6,829,544 B1 | 12/2004 | Kasztenny | |
| 6,934,654 B2 | 8/2005 | Benmouyal | |
| 6,944,555 B2 | 9/2005 | Blackett | |
| 6,949,921 B1 | 9/2005 | Feight | |
| 6,963,197 B1 | 11/2005 | Feight | |
| 6,998,848 B2 | 2/2006 | Kereit | |
| 7,023,691 B1 | 4/2006 | Feight | |
| 7,053,601 B1 | 5/2006 | Fenske | |
| 7,072,427 B2 | 7/2006 | Rawlins | |
| 7,106,048 B1 | 9/2006 | Feight | |
| 7,254,001 B2 | 8/2007 | Papallo | |
| 7,271,580 B1 | 9/2007 | Fenske | |
| 7,315,169 B1 | 1/2008 | Fenske | |
| 7,496,430 B2 | 2/2009 | Mak | |
| 7,720,619 B2 | 5/2010 | Hou | |
| 7,945,400 B2 | 5/2011 | Hou | |
| 8,526,156 B2 | 9/2013 | Schweitzer | |
| 9,160,158 B2 | 10/2015 | Schweitzer | |
| 2002/0181566 A1 | 12/2002 | Lund | |
| 2003/0085715 A1 | 5/2003 | Lubkema | |
| 2003/0146776 A1 | 8/2003 | Nakase | |
| 2004/0120090 A1 | 6/2004 | Galli | |
| 2005/0171647 A1 | 8/2005 | Kunsman | |
| 2005/0212524 A1 | 9/2005 | Ennis | |
| 2005/0231862 A1 | 10/2005 | Peterson | |
| 2006/0085146 A1 | 4/2006 | Peterson | |
| 2006/0215335 A1 | 9/2006 | Deshpande | |
| 2007/0055889 A1 | 3/2007 | Henneberry | |
| 2008/0012720 A1 | 1/2008 | Rostron | |
| 2008/0031520 A1 | 2/2008 | Hou | |
| 2008/0077336 A1 | 3/2008 | Fernandes | |
| 2009/0079417 A1 | 3/2009 | Mort | |
| 2010/0013632 A1* | 1/2010 | Salewske | G01R 19/2513 340/540 |
| 2010/0039741 A1 | 2/2010 | Booth | |
| 2010/0085036 A1* | 4/2010 | Banting | G01R 15/14 324/127 |
| 2010/0309004 A1 | 12/2010 | Grundler | |
| 2011/0012603 A1* | 1/2011 | Bose | G01R 31/3274 324/418 |
| 2012/0166141 A1* | 6/2012 | Watkins | G01R 19/2513 702/183 |
| 2013/0050882 A1 | 2/2013 | Rostron | |
| 2014/0280714 A1* | 9/2014 | Dolezilek | H04L 69/08 709/217 |
| 2017/0328945 A1 | 11/2017 | Achanta | |

OTHER PUBLICATIONS

S&C Electric Company, S&C Intellirupter PulseCloser Outdoor Distribution 14.4 kV and 25 kV Descriptive Bulletin, Feb. 7, 2006.
Anh Le, Dave Donovan, Bill Doherty, Technical Applications Data, Fisher Pierce Division of Pacific Scientific-Faulted Circuit Indicators, 1995.
Radio Receivers Series 1560 Handheld or RTU/SCADAhttp://www.joslynhivoltage.com/cat1560.htm, Joslyn Hi-Voltage, Jul. 21, 2008.
Fisher Pierce-Radio Faulted Circuit Indicator System www.joslynhivoltage.com, Joslyn Hi-Voltage, 1999.
Outage Advisor-Fault Detection & Location in Solution-B320-08001 www.cooperindustries.com, Cooper Power Systems, Grid Advisor 2008.
Outage Advisor-Fault Detection & Location Solution-Sensus Flexnet Communications-B320-08003 www.cooperindustries.com, Cooper Power Systems, Grid Advisor, 2008.
WebExchange B320-08005 www.cooperindustries.com, Cooper Power Systems, Grid Advisor, 2008.
Outage Advisor—Fault Detection & Location Solution—Cellular Communications B320-08002 www.cooperindustries.com, Cooper Power Systems, Grid Advisor, 2008.
Exchange B320-08004 www.cooperindustries.com, Cooper Power Systems, Grid Advisor, 2008.

(56) References Cited

OTHER PUBLICATIONS

PCT/US2017/056788 International Search Report and Written Opinion of the International Searching Authority, dated Jan. 30, 2018.

* cited by examiner

ELECTRIC POWER SYSTEM MONITORING USING DISTRIBUTED CONDUCTOR-MOUNTED DEVICES

RELATED APPLICATIONS

This application claims the benefit under 35 U.S.C. § 119(e) of U.S. Provisional Patent Application No. 62/408,868, filed Oct. 17, 2016, and titled "ELECTRIC POWER SYSTEM MONITORING USING DISTRIBUTED CONDUCTOR-MOUNTED DEVICES," which is incorporated herein by reference in its entirety.

TECHNICAL FIELD

This disclosure relates to monitoring and protection systems for electric power delivery systems using distributed conductor-mounted detectors.

BRIEF DESCRIPTION OF THE DRAWINGS

Non-limiting and non-exhaustive embodiments of the disclosure are described, including various embodiments of the disclosure, with reference to the figures, in which.

DETAILED DESCRIPTION

Figure 1:
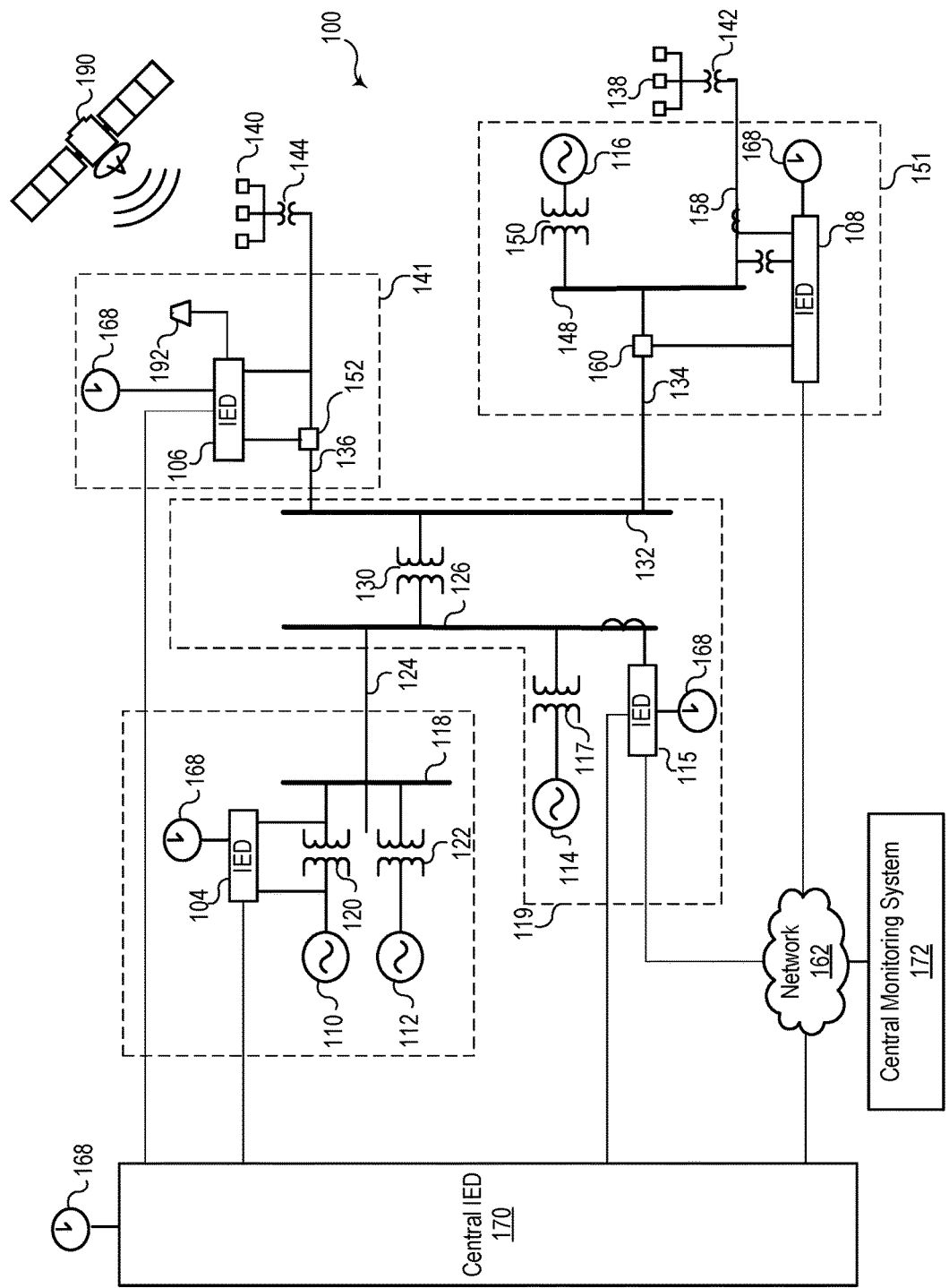
FIG. 1 illustrates a simplified diagram of one embodiment of an electric power delivery system that includes intelligent electronic devices consistent with embodiments of the present disclosure.

Electrical power systems commonly use conductors suspended between pylons to transmit and distribute electrical power. When a fault occurs in the electric power system, electrical energy transmitted through such conductors may be affected. Control systems may monitor electrical parameters throughout an electrical power system to detect and remediate faults. In various embodiments consistent with the present disclosure, a CMD may be suspended from a conductor in an electrical power system in a span between two pylons. The CMD may monitor the electrical parameters associated with the electrical energy flowing through the conductor to detect a fault and/or to detect a loss-of-current (LOC) condition. Information from the CMD may be used to monitor and control the power system. Still further, in some embodiments, CMDs may be placed around an area in which repair or maintenance of the electrical power system is being performed to monitor and detect potentially hazardous conditions and alert workers to such conditions.

Various embodiments consistent with the present disclosure may be utilized to increase the ability to identify the location of a fault and to improve the speed of response to a fault. More specifically, a plurality of CMDs may identify a specific path through an electric power system associated with a fault current. Improving the ability to locate a fault may provide a variety of advantages. Such advantages may include, but are not limited to, minimizing disruptions to consumers of electrical power provided by the power system and minimizing the time necessary to locate and repair a fault. Still further, the use of CMDs consistent with the present disclosure may reduce or eliminate time delays implemented on feeder lines comprising fuses. In some cases, a protective action may be delayed for a fault in an area of an electric power system including fused and unfused lines. The delay may permit fuses time to melt and thus limit the interruption of service to only the affected area. If a CMD on an unfused line identifies a fault current, however, the delay may be avoided.

Systems and methods consistent with the present disclosure may utilize a plurality of CMDs to monitor an electric power system. Such sensors may be configured to detect an electrical fault associated with the conductor on which the sensor is mounted and to transmit an indication of the fault. Further, in some embodiments, the CMDs may also be configured to identify a LOC condition. In some embodiments, conductor-mounted sensors consistent with the present disclosure may communicate either a fault condition or a LOC condition wirelessly with a control system. The control system may be configured to receive communications from one or more CMDs and may implement one or more control actions in response. In certain embodiments, the one or more control actions may be selected to minimize the disruption of electrical service provided by the electric power system by permitting identification of the smallest possible area of the electric power system to be de-energized due to the fault. In other embodiments, CMDs may be utilized to ensure that certain areas (e.g., work areas) of an electric power delivery system remain de-energized.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases or variations thereof, as recited throughout this specification, are not necessarily all referring to the same embodiment.

Several aspects of the embodiments described are illustrated as software modules or components. As used herein, a software module or component may include any type of computer instruction or computer-executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions. In some embodiments, the computer or other electronic device may include a processing device such as a microprocessor, microcontroller, logic circuitry, or the like. The processing device may further include one or more special-purpose processing devices such as an application-specific interface circuit (ASIC), programmable array logic (PAL), programmable logic array (PLA), programmable logic device (PLD), field programmable gate array (FPGA), or any other customizable or programmable device.

Electrical power generation and delivery systems are designed to generate, transmit, and distribute electrical energy to loads. Electrical power generation and delivery systems may include a variety of equipment, such as electrical generators, electrical motors, power transformers, power transmission and distribution lines, circuit breakers, switches, buses, transmission and/or feeder lines, voltage regulators, capacitor banks, and the like. Such equipment may be monitored, controlled, automated, and/or protected using intelligent electronic devices (IEDs) that receive electric power system information from the equipment, make decisions based on the information, and provide monitoring, control, protection, and/or automation outputs to the equipment.

In some embodiments, an IED may include, for example, remote terminal units, differential relays, distance relays, directional relays, feeder relays, overcurrent relays, voltage regulator controls, voltage relays, breaker failure relays, generator relays, motor relays, automation controllers, real-time automation controllers, bay controllers, meters, recloser controls, communication processors, computing platforms, programmable logic controllers (PLCs), programmable automation controllers, input and output modules, governors, exciters, statcom controllers, static var compensator (SVC), on-load tap-changer (OLTC) controllers, and the like. Further, in some embodiments, IEDs may be communicatively connected via a network that includes, for example, multiplexers, routers, hubs, gateways, firewalls, and/or switches to facilitate communications on the networks, each of which may also function as an IED. Networking and communication devices may also be integrated into an IED and/or be in communication with an IED. As used herein, an IED may include a single discrete IED or a system of multiple IEDs operating together.

Electrical power delivery system equipment may be monitored and protected from various malfunctions and/or conditions using one or more IEDs. For example, an IED may be configured to detect and protect the electrical power system equipment from abnormal conditions, such as fault events. IEDs may be configured to take protective actions such as commanding a circuit breaker to open, in the event of a detected fault. IEDs may further be configured to determine a distance and/or direction to a fault based on operating conditions detected during the fault event.

In several embodiments herein, IEDs may be coordinated in the monitoring and protection functions applied to electric power delivery systems. For example, the IEDs may be coordinated to operate to remove electric power from the smallest portion of the electric power system practical while removing the fault from the electric power delivery system. IEDs may be coordinated to operate to maintain voltage and/or frequency within acceptable levels on the electric power delivery system by operating voltage regulators, capacitor banks, reactors, and the like at various locations on the electric power delivery system. Furthermore, IEDs may be coordinated to determine event locations on the electric power delivery system.

FIG. 1 illustrates a simplified one-line diagram of an electric power delivery system 100 consistent with embodiments of the present disclosure. Electric power delivery system 100 may be configured to generate, transmit, and distribute electric energy to loads. Electric power delivery systems may include equipment such as electric generators (e.g., generators 110, 112, 114, and 116), power transformers (e.g., transformers 117, 120, 122, 130, 142, 144 and 150), power transmission and delivery lines (e.g., lines 124, 134, 136, and 158), circuit breakers (e.g., breakers 152, 160), busses (e.g., busses 118, 126, 132, and 148), loads (e.g., loads 140, and 138) and the like. In various embodiments, the electrical generators may comprise distributed generation sources (e.g., solar or wind generation). A variety of other types of equipment may also be included in electric power delivery system 100, such as voltage regulators, capacitor banks, and the like.

Substation 119 may include a generator 114, which may be a distributed generator, and which may be connected to bus 126 through step-up transformer 117. Bus 126 may be connected to a distribution bus 132 via a step-down transformer 130. Various distribution lines 136 and 134 may be connected to distribution bus 132. Distribution line 136 may lead to substation 141 where the line is monitored and/or controlled using IED 106, which may selectively open and close breaker 152. Load 140 may be fed from distribution line 136. Further, step-down transformer 144 in communication with distribution bus 132 via distribution line 136 may be used to step down a voltage for consumption by load 140.

Distribution line 134 may lead to substation 151, and deliver electric power to bus 148. Bus 148 may also receive electric power from distributed generator 116 via transformer 150. Distribution line 158 may deliver electric power from bus 148 to load 138, and may include further step-down transformer 142. Circuit breaker 160 may be used to selectively connect bus 148 to distribution line 134. IED 108 may be used to monitor and/or control circuit breaker 160 as well as distribution line 158.

Electric power delivery system 100 may be monitored, controlled, automated, and/or protected using intelligent electronic devices (IEDs), such as IEDs 104, 106, 108, 115, and 170, and a central monitoring system 172. In general, IEDs in an electric power generation and transmission system may be used for protection, control, automation, and/or monitoring of equipment in the system. For example, IEDs may be used to monitor equipment of many types, including electric transmission lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment.

As used herein, an IED (such as IEDs 104, 106, 108, 115, and 170) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

Central monitoring system 172 may comprise one or more of a variety of types of systems. For example, central monitoring system 172 may include a supervisory control and data acquisition (SCADA) system and/or a wide area control and situational awareness (WACSA) system. A central IED 170 may be in communication with IEDs 104, 106, 108, and 115. IEDs 104, 106, 108 and 115 may be remote from the central IED 170, and may communicate over various media such as a direct communication from IED 106 or over a wide-area communications network 162. According to various embodiments, certain IEDs may be in direct communication with other IEDs (e.g., IED 104 is in direct communication with central IED 170) or may be in communication via a communication network 162 (e.g., IED 108 is in communication with central IED 170 via communication network 162).

In various embodiments, IEDs 104, 106, 108, 115, and 170 may be configured to monitor the frequency of alternating current waveforms, voltage levels, or other electrical conditions in system 100. Network 162 may be used to transmit information among various components in system 100, including IEDs 108, 115, 170, and central monitoring system 172. In various embodiments, network 162 may be configured to provide measurements that may be analyzed consistent with the present disclosure to detect anomalies.

A common time signal 168 may be used to time-align measurements for comparison and/or to synchronize action across system 100. Utilizing a common or universal time source may ensure that IEDs have a synchronized time signal that can be used to generate time-synchronized data, such as synchrophasors. In various embodiments, the common time source may comprise a time signal from a global navigation satellite system ("GNSS") 190. IED 106 may include a receiver 192 configured to receive the time signal from the GNSS system 190. In various embodiments, IED 106 may be configured to distribute the time signal to other components in system 100, such as IEDs 104, 108, 115, and 170.

Overhead conductors or powerlines may be used to transmit and/or distribute power in system 100. A plurality of CMDs may be mounted on such conductors and may monitor the flow of electrical energy through such conductors. In various embodiments, the sensors may monitor and gather energy from the conductors for operation.

Consistent with embodiments disclosed herein, IEDs 104-108 may be configured to detect and/or identify one or more events from monitored system data, including information gathered by CMDs consistent with the present disclosure. For example, IEDs 104-108 may be configured to receive current information and/or measurements (e.g., current measurements of a transmission and/or a feeder line) and, based on the current information and/or measurements, detect and/or identify fault events.

Figure 2A:
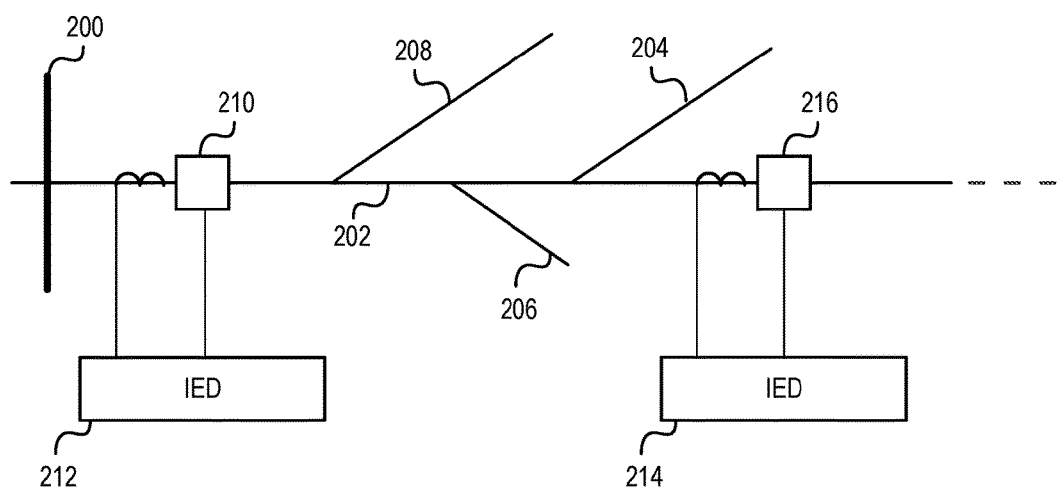
FIG. 2A illustrates a simplified one-line diagram of an electric power system including a plurality of feeder lines consistent with embodiments of the present disclosure.

FIG. 2A illustrates a simplified one-line diagram of an electric power system including a plurality of feeder lines consistent with embodiments of the present disclosure. A distribution bus 200 may be electrically coupled to a distribution feeder line 202 having a plurality of feeder lines 204-208 leading therefrom (e.g., feeder lines leading to one or more loads or the like). IED 212 may monitor certain measured parameters of a first location of the feeder line 202 including, among other things, a current flow through the feeder line at the monitored location. For example, IED 212 may be associated with a distribution substation location of an electric power delivery system. IED 212 may be communicatively coupled with a breaker 210 that may be configured to disconnect a portion of the electric power delivery system when actuated by IED 212 (e.g., in response to IED 212 detecting a fault). IED 214 may similarly monitor measured parameters (e.g., current) at a second location of the feeder line 202 and be configured to actuate (e.g., trip) a communicatively-coupled breaker 216 upon detecting an event.

Figure 2B:
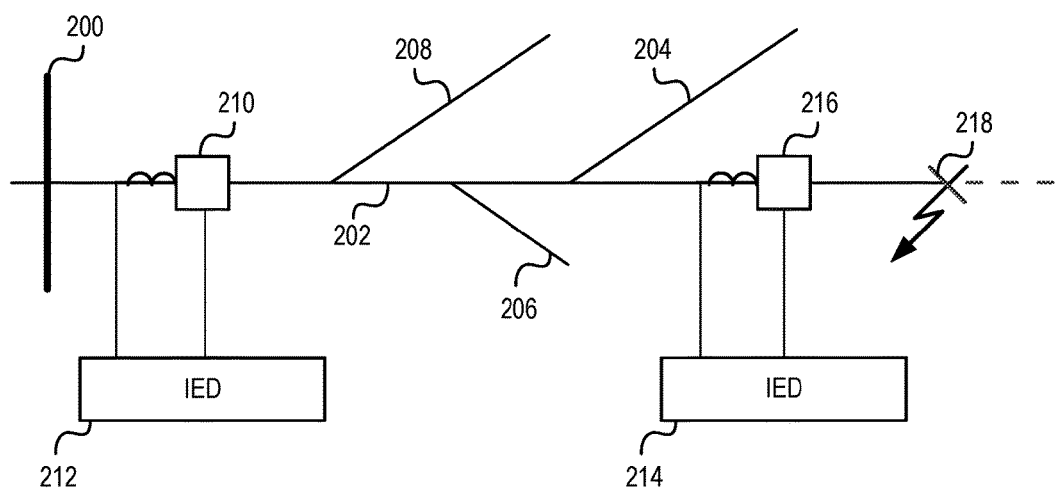
FIG. 2B illustrates the system of FIG. 2A in which a fault occurs and in which a plurality of conductor-mounted detectors ("CMDs") may be used to identify the location of the fault consistent with embodiments of the present disclosure.

FIG. 2B illustrates the system of FIG. 2A in which a fault occurs and in which a plurality of CMDs may be used to identify the location of the fault consistent with embodiments of the present disclosure. As illustrated, fault 218 may occur on the distribution feeder line 202 due to a variety of conditions (e.g., when a tree or other object contacts the line and/or when a conductor contacts the ground). IEDs 212 and 214 may identify the occurrence of the fault 218 on the distribution feeder line 202 and may take one or more suitable protective actions to remedy potentially unsafe conditions and damage to the electric power delivery system resulting from the fault. For example, upon detecting the occurrence of the fault 218, IED 214 may trip breaker 216, thereby isolating the fault 218 from the electric power delivery system.

IEDs 212 and 214 may be able to determine that the fault occurred further away from the distribution bus 200 than IED 212; however, due to the fact that IEDs 212 and 214 monitor only two specific locations, it may be difficult to determine with particularity the location of a fault based solely on the information available to IEDs 212 and 214. In the illustrated configuration, feeder lines 204, 206, and 208 may remain energized while the fault 218 is addressed. If a fault occurred on one of feeder lines 204, 206, or 208, however, breaker 210 would need to be tripped to de-energize the portion of the electric power system affected by the fault. Repair crews may then be required to inspect each feeder line 204, 206, or 208 to identify the location of the fault. Such inspections can be time consuming and costly to conduct. Although this issue may be addressed by installing an IED or other equipment at each feeder, such a solution may be cost prohibitive and may increase the complexity of the control system.

Systems and methods consistent with the present disclosure may provide additional information regarding the location of a fault by permitting the monitoring of each feeder using CMDs configured to detect electrical parameters associated with a fault. In various embodiments, the CMDs may be inexpensive relative to the cost of an IED, thus permitting such devices to be installed at many additional locations in an electric power system. The presence of such devices may be used to identify the location of a fault with greater specificity and to improve the availability of a control system to minimize the impact of the fault on the electric power system.

Figure 3:
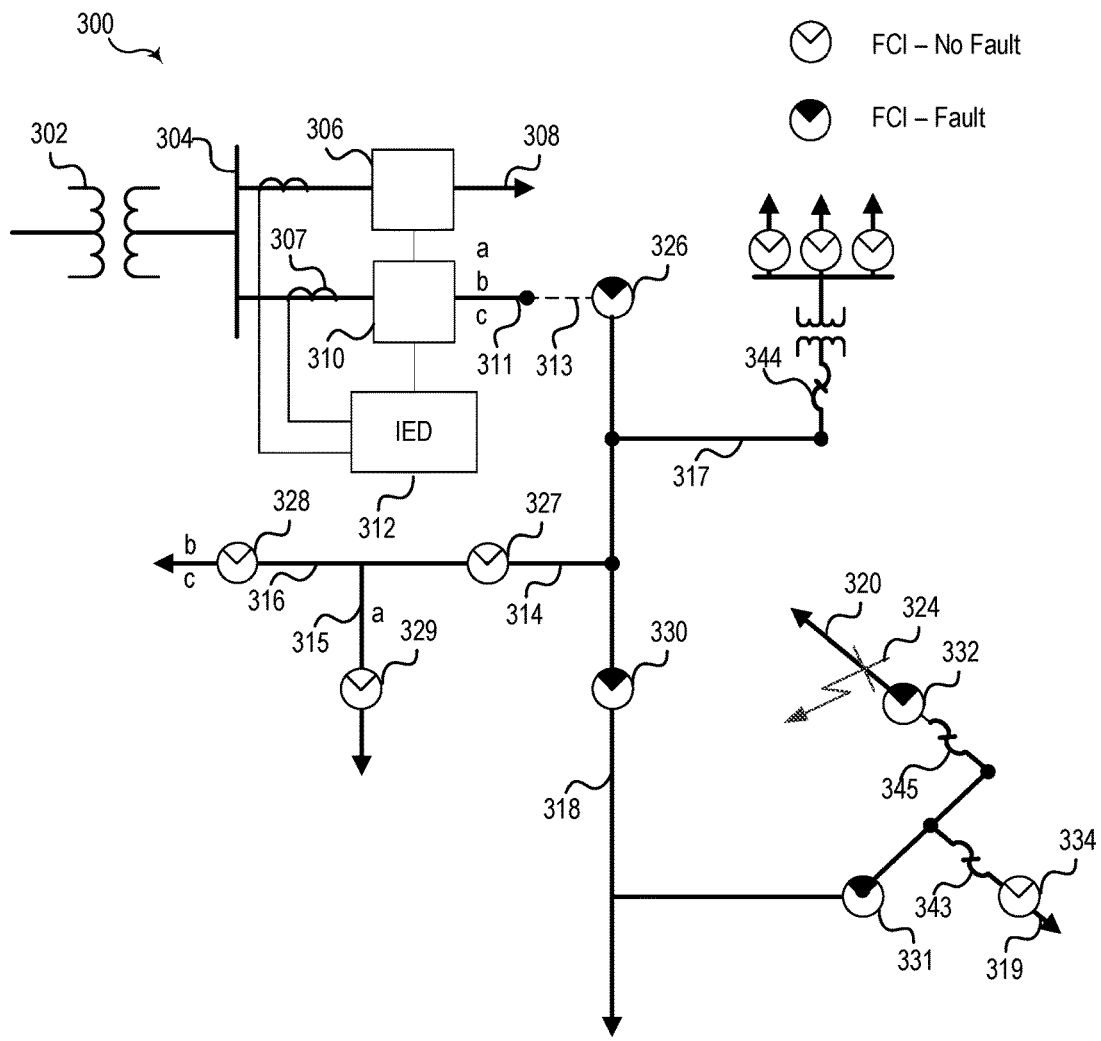
FIG. 3 illustrates a simplified one-line diagram of an electric power system including a plurality of branches monitored by a plurality of CMDs for detecting faults consistent with embodiments of the present disclosure.

FIG. 3 illustrates a simplified one-line diagram of an electric power system 300 including a plurality of branches monitored by a plurality of CMDs for detecting faults consistent with embodiments of the present disclosure. A distribution bus 304 is coupled to a step-down transformer 302. The distribution bus 304 is electrically coupled to distribution feeder lines 308 and 311. Feeder line 311 may include both underground lines 313 (shown in dashed lines) and overhead powerlines (shown in solid lines) and may provide electrical power to a plurality of branches 314-320. System 300 also includes three-phase branches, a two-phase branch (i.e., branch 316), and a single-phase branch (i.e., branch 315). Certain branches may also include a plurality of fuses 343-345 that may melt in response to a fault current flowing through the fuse.

An IED 312 may monitor certain measured parameters, including, among other things, a current flow through the feeder lines. IED 312 may be communicatively coupled with breakers 306 and 310 that may be configured to disconnect a portion of the electric power delivery system when actuated by IED 312 (e.g., in response to the occurrence of a fault).

IED 312 may further be in communication with a plurality of CMDs 326-334 configured to detect a fault current flowing through the conductor on which each CMD is mounted. Each CMD 326-334 may draw power from the conductor on which it is mounted. Further, each CMD 326-334 may be configured to transmit an indication of a fault to the IED 312. In various embodiments, the indication of the fault may be transmitted wirelessly to IED 312. Wireless transmission of the indication of the fault may facilitate the installation of monitoring systems consistent with the present disclosure on existing electric power systems.

Upon the occurrence of a fault on feeder line 311, IED 312 may analyze information provided by the plurality of CMDs to determine whether to trip the breaker 310 or to rely on fuses 343-345. As may be appreciated, if a fault occurs on a branch that does not include a fuse (e.g., branches 314-318), tripping the breaker 310 may be the only control strategy available for IED 312 to de-energize the portion of system 300 affected by the fault 324. Accordingly, any delays built into the system to permit fuses to melt may be avoided by determining that a fault has occurred on an unfused line and immediately actuating breaker 310.

Based on information available from the plurality of CMDs 326-334, IED 312 may be able to determine that a fault 324 has occurred on branch 320. More specifically, CMDs 326, 330, 331, and 332 may each identify a fault current and communicate the detection of the fault current to IED 312. In various embodiments, the identification of the fault current may be transmitted wirelessly by CMDs 326, 330, 331, and 332 to IED 312.

Still further, IED 312 may also utilize information obtained from monitoring current flow through line 311 using a current transformer 307. Increased current caused by fault 324 may be directly detected by IED 312, in addition to detection of the current by CMDs. The use of multiple monitoring systems (i.e., current transformer 307 and CMDs 326-334) may reduce the likelihood that spoofed signals may be used to cause IED 312 to implement a protective action.

Using the topography of system 300 and the location of conductor-mounted devices that identify the fault current, the IED may identify two possible actions to de-energize branch 320, namely: (1) wait for fuse 335 to melt due to the fault current, or (2) actuate breaker 310. Actuating breaker 310 de-energizes all branches associated with feeder 311, while waiting for fuse 335 to melt only de-energizes the specifically affected branch (i.e., branch 320).

For fuse-blowing or trip-saving schemes, IED 312 may typically be set to operate more slowly than the fuse curves of fuses 343-335. Without specific information about the location of a fault provided by the plurality of CMDs 326-334, IED 312 may be configured to wait the necessary time for fuses 343-345 to melt. This is because the IED 312 cannot determine whether the fault occurred on a branch with a fuse or on a branch without a fuse. In other words, IED 312 would apply the same scheme for all the downstream faults regardless of whether the faults are on fuse-protected branches or not. Such a scheme may cause unnecessary delays in tripping for faults on unfused branches. In contrast, the availability of information provided by the plurality of CMDs 326-334 may allow IED 312 to operate immediately if a fault occurs on an unfused branch in system 300. Clearing faults more quickly in an electric power system has several benefits, including increased reliability, improved safety, and reduced outage duration.

Additional information regarding the location of faults and alternative control strategies may allow an operator to improve the overall reliability of an electric power system in several ways. For example, in the illustrated embodiment, waiting for fuse 335 to melt decreases the number of consumers affected by an outage. Such a reduction may improve the Customer Average Interruption Duration Index (CAIDI) metric in comparison to tripping breaker 310.

Figure 4A:
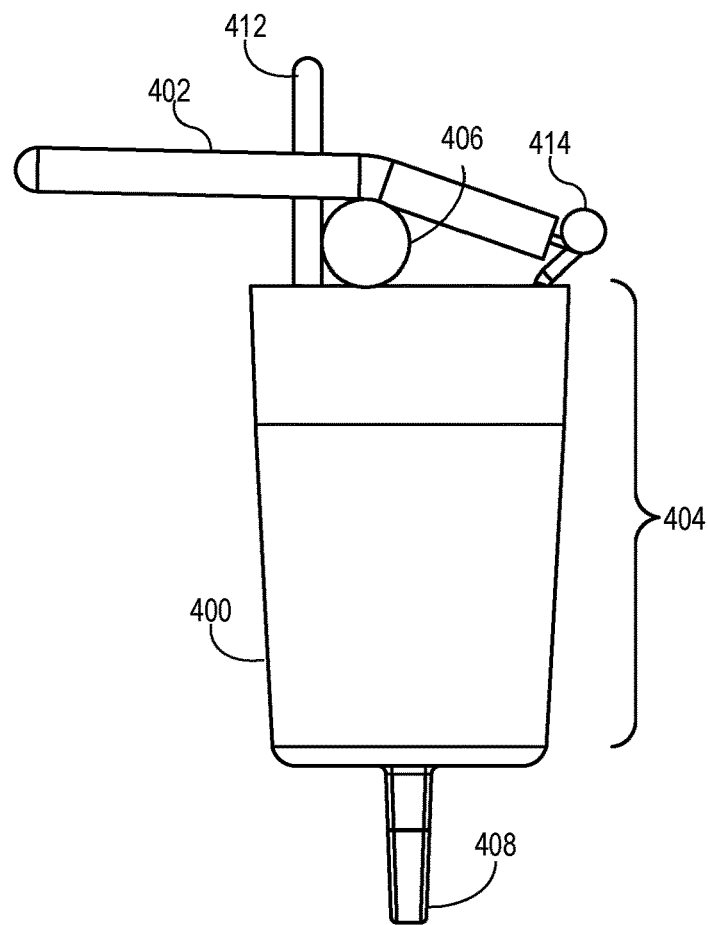
FIG. 4A illustrates a side view of a CMD consistent with embodiments of the present disclosure.

FIG. 4A illustrates a side view of a CMD consistent with embodiments of the present disclosure. The CMD 400 may include a housing 404 and a protruding eye 408 that allows for the use of a hot stick during installation to or removal from a conductor 406. Although not shown in the illustrated orientation, the eye 408 may include an aperture that may be grasped using a hot stick. The housing 404 houses the various circuitry and other modules of the CMD 400. One component in the housing 404 is a current transformer (discussed below). The current transformer includes a pole piece 412 that extends through the housing 404 in an orientation that is generally perpendicular to the rear face of the housing 404. The exterior portion of the pole piece 412 may be coated with an insulating material or may have an insulating sleeve disposed thereon. A clamp assembly 402 attaches the CMD 400 to the monitored conductor such as a conductor 406, and holds the conductor 406 in proximity to the pole piece 412 of the current transformer. The clamp assembly 402 connected to the housing 404 by a hinge 414 is designed to accommodate for a range of conductors 406 having different diameters. When installed on a typical overhead conductor, the CMD 400 hangs such that the pole piece 412 is directed generally upward.

Figure 4B:
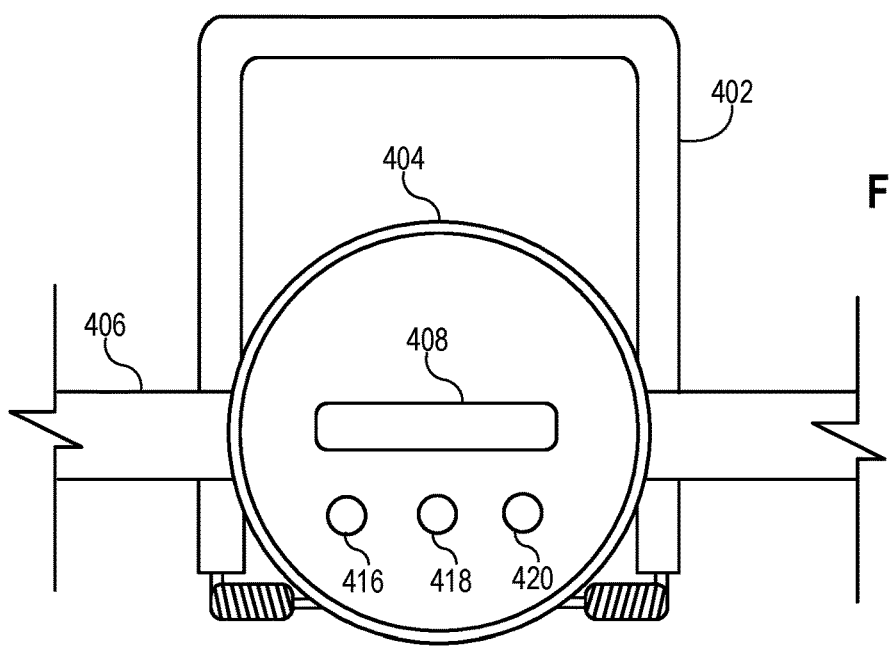
FIG. 4B illustrates a bottom view of the CMD of FIG. 4A consistent with embodiments of the present disclosure.

FIG. 4B illustrates a bottom view of the CMD of FIG. 4A consistent with embodiments of the present disclosure. FIG. 4B illustrates a face of the CMD 400, which may be directed in a downward direction when the CMD 400 is installed on an overhead conductor. The face may include a plurality of transmitters such as, for example, a fiber-optic port 416 (such as an ST connector) and a radio antenna 418. The face may also include a visual indicator 420. In one embodiment, the visual indicator 420 may be embodied as a LED. The LED may provide a visual indicator of a status of the CMD 400. For example, the LED may be illuminated following a fault to provide a visual identifier that repair crews may use to identify the location of the fault. The transmitters 416 and 418 may be configured to provide the high-speed communication using light (e.g. infrared over fiber optics or a laser) and/or radio signals. The CMD may be in communication with an IED using one or more of the transmitters 416 and 418. In one embodiment, the CMD 400 may be configured to identify and transmit an indication of a fault condition within 6 milliseconds of the current through an associated conductor rising above a threshold associated with a fault condition.

Figure 5:
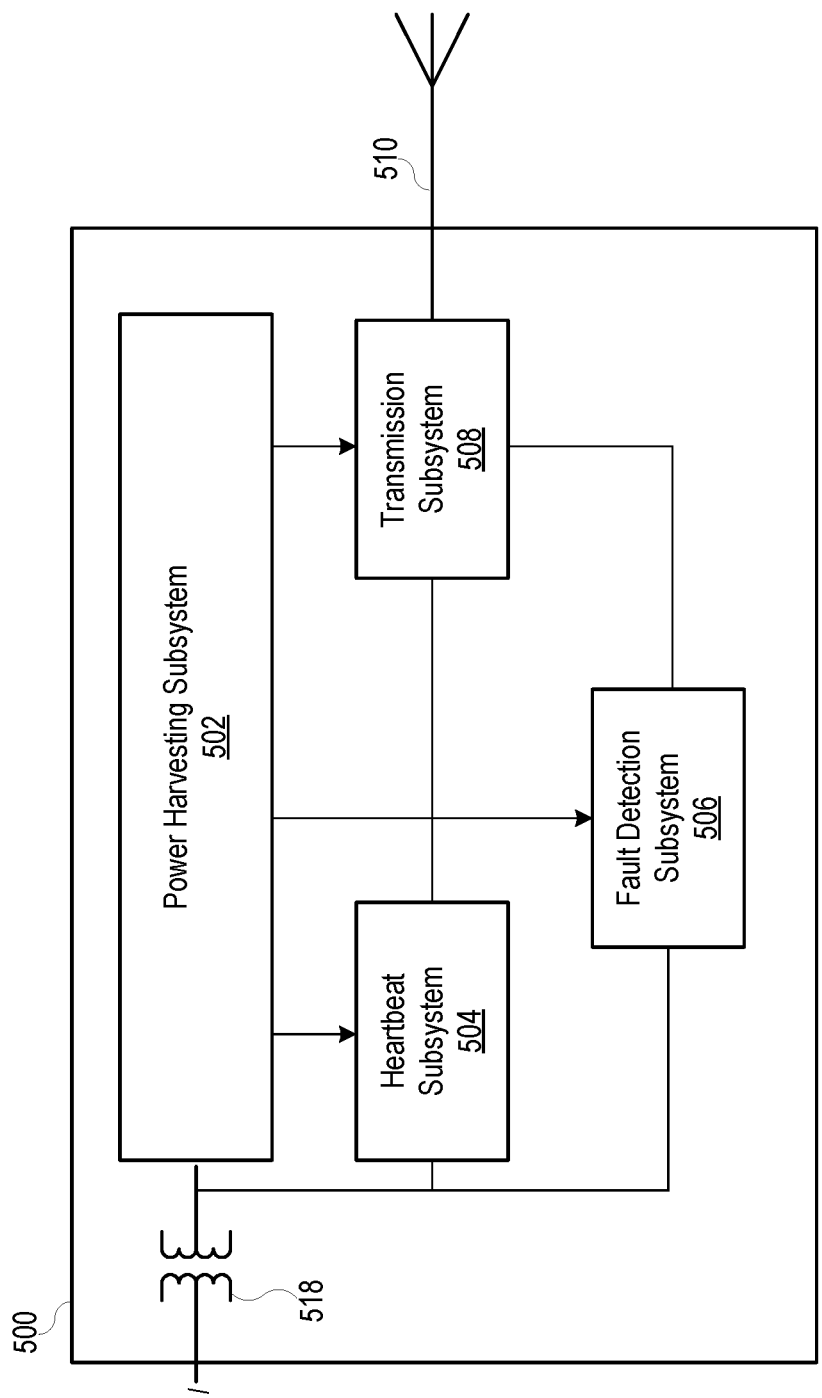
FIG. 5 illustrates a functional block diagram of a CMD configured to provide a signal to one or more intelligent electronic devices consistent with embodiments of the present disclosure.

FIG. 5 illustrates a functional block diagram of a CMD 500 configured to provide a signal to one or more intelligent electronic devices consistent with embodiments of the present disclosure. The CMD 500 may include the components necessary to provide multiple signals to an IED in communication therewith. One such signal may be a heartbeat signal configured to indicate that the CMD 500 is functional. Another such signal may be a fault signal indicating a fault on the conductor monitored by the CMD 500.

The CMD 500, according to the illustrated embodiment, receives a current signal, such as a current signal provided by a pole piece 412 (as seen in FIG. 4A). In certain embodiments, the signal provided may be further stepped down using, for example, a transformer 518 to convert the signal into one useable by the CMD 500. The signal may be provided to a power harvesting subsystem 502. The power harvesting subsystem 502 may be configured to receive the signal from the electric power conductor, derive power therefrom, condition the power derived therefrom, and provide electrical power within predetermined specifications to the other various modules of the CMD 500. The power harvesting subsystem 502 may receive an alternating current signal and include the necessary components to convert the power derived therefrom to a direct current. The power harvesting subsystem 502 may include a capacitor or a super-capacitor capable of storing power for use when power cannot be harvested from the conductor.

A heartbeat subsystem 504 may receive the signal from the transformer 518 and be configured to signal a transmission subsystem 508 to activate and send a signal to an IED (via antenna 510) when the CMD 500 is functional and/or when the current on the conductor is within operating parameters. The heartbeat subsystem 504 may include a timer, and be configured to initiate the transmission subsystem 508 and assert the heartbeat signal at multiples of a lapse of the timer. In one embodiment, the heartbeat subsystem 504 may be configured to initiate the transmission subsystem 508 and assert the heartbeat signal according to a schedule (e.g., once per day). In another embodiment, the heartbeat subsystem 504 may be configured to initiate the transmission subsystem 508 and assert the heartbeat signal once every 10 minutes. Other schedules are also contemplated. The heartbeat subsystem 504 may be configured to communication via transmission subsystem 508 and assert the heartbeat signal according to any schedule. The schedule may be limited by the amount of power available from the power harvesting subsystem 502, as well as the amount of power required by the heartbeat subsystem 504 and the transmission subsystem 508. In some embodiments, the heartbeat subsystem 504 may be configured to assert the heartbeat signal once per second. In certain embodiments, the CMD 500 may be configured to supply a continuous heartbeat.

The CMD 500 may further include a fault detection subsystem 506 configured to receive the current signal from the transformer 518. In certain embodiments, the fault detection subsystem 506 may include a processor. In certain embodiments, the fault detection subsystem 506 may receive power from the power harvesting subsystem 502. In other embodiments, the fault detection subsystem 506 may be implemented in hardware (e.g., as an integrated circuit, an application-specific integrated circuit, or the like).

In one embodiment, the fault detection subsystem 506 may include a comparator for comparing an element of the signal from the transformer 518 with a predetermined threshold. For example, the comparator may compare a voltage derived from the signal from the transformer 518 with a predetermined voltage threshold. If the derived voltage falls below the voltage threshold, then the fault detection subsystem 506 may determine a fault. When the fault detection subsystem 506 determines a fault, the fault detection subsystem 506 may initiate the transmission subsystem 508 to transmit a fault signal to IEDs.

In one embodiment, when the derived voltage is too low, the power harvesting subsystem 502 may be unable to obtain power from the conductor. The power harvesting subsystem 502 may include a capacitor or a battery (not shown) for storing power for the instance when power to the transformer 518 is lost, such that the fault detection subsystem 506 and the transmission subsystem 508 may have access to sufficient power to transmit a fault signal to IEDs. Such a power source may also be used to transmit a signal when a LOC condition is detected.

Accordingly, the CMD 500 may be configured to periodically transmit a heartbeat signal to one or more IEDs, and upon loss of power to the monitored conductor, may transmit a fault signal to one or more IEDs. In certain embodiments, the CMD may be configured as a faulted circuit indicator in that it includes further components such as a microprocessor capable of detecting a fault condition and/or a LOC condition on the monitored conductor.

Figure 6:
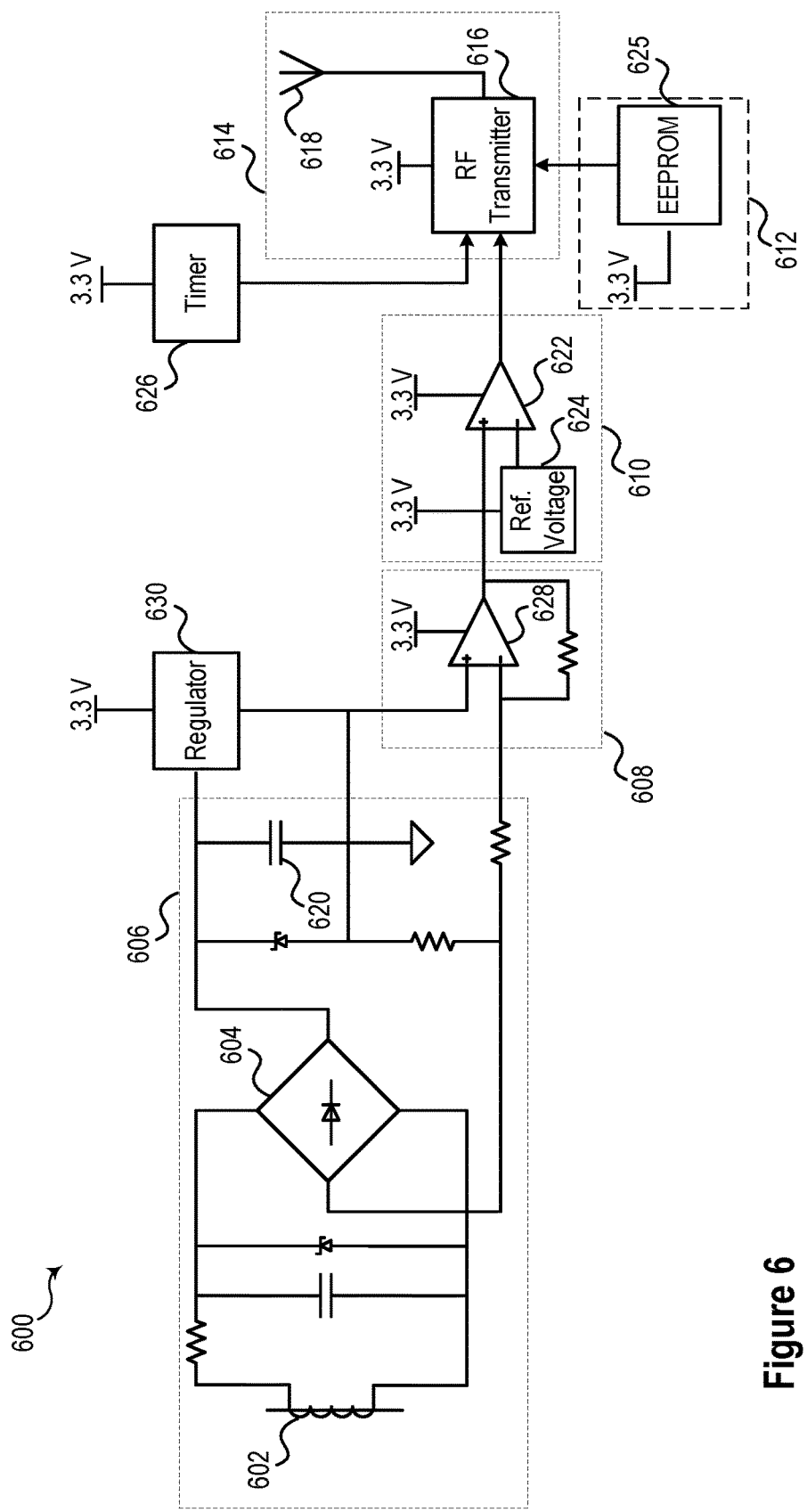
FIG. 6 illustrates a simplified circuit diagram of a CMD for identifying and signaling a fault current or a loss-of-current condition to intelligent electronic devices consistent with embodiments of the present disclosure.

FIG. 6 illustrates a simplified circuit diagram of a CMD 600 for identifying and signaling a fault current or a LOC condition to intelligent electronic devices consistent with embodiments of the present disclosure. The diagram illustrates the use of a CMD configured for use in the monitoring and protection of an electric power delivery system. In various embodiments, a CMD 600 may be configured to detect (1) a fault current condition and (2) a LOC condition.

Several functional blocks are identified in FIG. 6, including a power harvesting subsystem 606, an amplifier subsystem 608, a fault detection subsystem 610, a settings subsystem 612, and a transmission subsystem 614. One skilled in the art will recognize that these functional blocks may be implemented in a variety of configurations and that the illustrated embodiment is provided merely by way of example.

A power harvesting subsystem 606 may be configured to store the energy harvested from the electrical conductor. The power harvesting subsystem 606 may include a transformer 602 configured to step down power from an electrical conductor in an electric power system. A rectifier subsystem 604 may rectify alternating current from the electric power system to direct current suitable for use by CMD 600. In the illustrated embodiment, electrical power is stored in capacitor 620. In other embodiments, a battery (not shown) may be used to store electrical power. In various embodiments, the battery may be either rechargeable or non-rechargeable. The electrical energy stored in power harvesting subsystem 606 may be used to ensure that CMD 600 is ready to detect a fault condition and/or a LOC condition on the power line and to transmit a signal reflecting such conditions. In some embodiments, the CMD may also use the harvested power to send periodic heartbeat signals to confirm ongoing operation of the CMD 600.

A fault condition or a LOC condition may be detected using the amplifier subsystem 608 and the detection subsystem 610. The amplifier subsystem 608 may include an operational amplifier 628 in a non-inverting configuration. In the illustrated embodiment, the positive input is coupled to a voltage regulator 630 and the negative input is coupled to the rectifier subsystem 604.

The detection subsystem 610 uses an amplifier 622, voltage reference 624 and the output of the amplifier subsystem 608 to detect a fault current or a LOC within a few milliseconds of an event. The reference voltage 624 may be at an appropriate threshold established to detect either a fault current or a LOC condition. A LOC condition may follow detection of a fault and may provide verification that a portion of an electric power system affected by a fault has been de-energized. In some embodiments, a CMD may include a first detection subsystem 610 with a first reference voltage 624 to detect a fault current, and a second detection subsystem 610 with a second reference voltage 624 to detect a LOC condition.

In some embodiments, the reference voltage 624 may be automatically determined based on the current flow through the conductor. For example, the reference voltage may represent an average of the current flow over a specified time window. Accordingly, relatively large deviations in the current flow in a short period may be identified as a fault, while more gradual increases in current associated with changes in load may not be identified as a fault. In other embodiments, the fault current threshold may represent a static value. In one specific embodiment, the fault threshold may be set using a plurality of DIP switches on the CMD.

The detection subsystem 610 may be in communication with a transmitter subsystem 614. The transmitter subsystem 614 includes an RF transmitter 616 in electrical communication with an antenna 618. Detection of a fault condition and/or a LOC condition by the detection subsystem 610 may be transmitted by transmitter subsystem 614. The circuit also shows a timer 626 that may be configured to transmit a heartbeat signal according to an established schedule to indicate that the CMD is active and operational.

An IED (not shown) may be configured to receive and decode information from CMD 600. Information from CMD 600 may be configured to communicate such information to an IED or other control systems operable to control an electric power system or a portion of an electric power system. In some embodiments, an IED or other control system may be configured to identify a type of fault using data from the CMD. For example, in the case of short circuit faults, the CMD may send a fault message followed by a LOC condition message (due to protective relays clearing the fault). For the downed conductor faults, the CMD may only send a LOC message to the IED via the receiver. For temporary faults, a fault message may be received and the heartbeat signal may resume shortly thereafter. The temporary fault may be cleared by an automatic reclose operation that resolves the fault without the need for additional control actions.

In some embodiments, failure to receive the heartbeat signal may provide an indication of the occurrence of a fault. For example, a CMD may be configured to transmit the heartbeat signal every 15 seconds. If the heartbeat signal is not received for a period greater than 15 seconds, the most likely explanation may be a LOC condition affecting a conductor associated with the CMD. Although the cause of the LOC condition may not be readily discernable from the LOC condition, the failure to receive a heartbeat signal from multiple CMDs in a system may provide an indication of the location of the condition that caused the LOC condition. There may be a variety of circumstances in which a CMD may experience a fault, but where an associated IED may identify the event only by an interruption in the schedule of the heartbeat signal (i.e., the failure to receive the heartbeat signal). For example, interference may temporarily interfere with the transmission and may have blocked the transmission of an indication of a fault condition. Alternatively, the CMD may not have had sufficient stored power to transmit an indication of a fault condition. Such a scenario may be more likely where the CMD is powered by a capacitor charged by an associated conductor.

In several embodiments described herein, a plurality of CMDs may be provided on a single electric power delivery system, and a plurality of IEDs may receive communication from the plurality of CMDs. Accordingly, the communications from each of the CMDs may be distinct from the communications of other CMDs such that the IEDs may distinguish between the communications from each of the CMDs. In one embodiment, each particular CMD may be configured to communicate at a radio frequency that is distinct from the radio frequencies of other CMDs within range of a particular IED. Thus, the IED may differentiate between multiple CMDs based on the communication frequency of the CMDs. The RF transmitter 616 may be configured to communicate according to the frequency. In one embodiment, a number of predetermined frequencies are selectable upon commissioning of the CMD. The CMD may include a selector for the user to select a particular communication frequency of the CMD. The selected frequency may be stored in a storage subsystem 612. In the illustrated embodiment, storage subsystem 612 may include an EEPROM memory 625 that stores a particular frequency or a unique identifier included in the message that may be used by a receiver to identify CMD 600.

In another embodiment, communications from each a plurality of CMDs may include a unique identifier at a predetermined location in the communication. The unique identifier may be assigned to the particular CMD. For example, each communication from a particular CMD may begin with a signal representative of the CMDs particular address. Thus, the receiving IED may differentiate communications from each CMD based on the unique identifier in each message from each CMD. In such embodiment, the address may be stored in the storage subsystem 612, and added to the message by the RF transmitter 616. In one embodiment, the identifier may be set at manufacturing, and indicated in human-readable form on the CMD. In another embodiment, the identifier may be selectable upon commissioning of the CMD by a selector available to a user. The address selection may be stored in the EEPRO and read by the RF Transmitter.

Figure 7A:
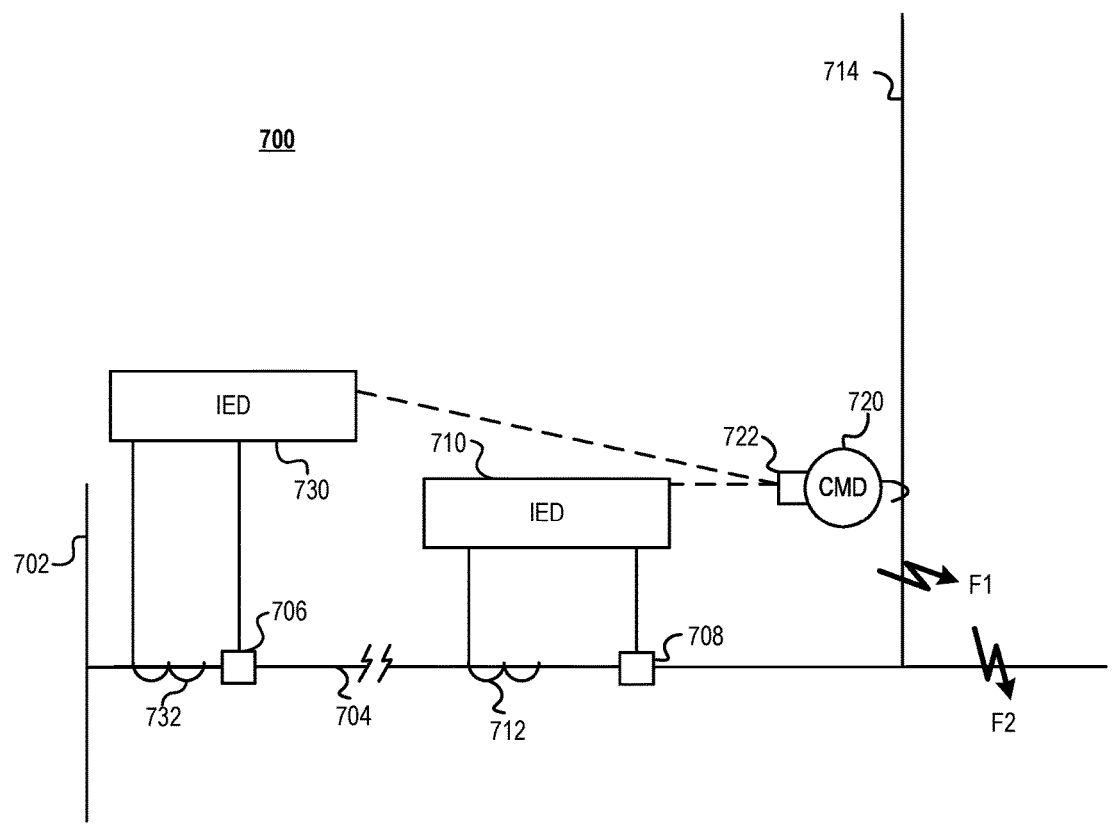
FIG. 7A illustrates a simplified one-line diagram of a system configured to coordinate protection of an electric power delivery system wherein a CMD transmits information to multiple IEDs consistent with embodiments of the present disclosure.

FIG. 7A illustrates a simplified one-line diagram of a system 700 configured to coordinate protection of an electric power delivery system wherein a CMD transmits information to multiple IEDs consistent with embodiments of the present disclosure. The electric power delivery system may include a bus 702, feeder 704, branch 714, and may include further buses, feeders, and branches. Feeder 704 is monitored using an IED 730, which may obtain electric power system signals using CTs (such as CT 732), PTs, and the like. IED 730 may be in communication with a circuit breaker 706, and may be configured to signal the circuit breaker 706 to open if an event is detected.

Downstream of IED 730, a second IED 710 may be configured to monitor a portion of the electric power system. IED 730 may obtain electric power system signals from feeder 704 using, for example, CTs (such as CT 712), PTs, and the like. IED 710 may be in communication with a circuit breaker 708, and be configured to signal the circuit breaker 708 to open upon detection of an event. As described above, upon occurrence of an event, the IEDs 730 and 710 may be configured to coordinate to provide the best protection to the electric power delivery system. In some embodiments, such coordination may be configured such that the circuit breaker closest to the fault opens. In certain embodiments, such coordination may be configured to remove power from the smallest portion of the electric power delivery system possible to de-energize a location affected by a fault. In some instances, it might be desirable to change protection schemes based on which branch the fault occurs. The scheme for a fault F1 might be different than the scheme for the fault on F2. In some embodiments, a fault may be detected while the fault is still active, and as such, an IED may implement a protective action tailored to the specific fault. For example, if branch 714 serves a rural area with many trees that may temporarily contact a conductor, an IED may be configured to respond differently to fault F1 than to a fault F2 on feeder 704, which may serve urban or residential neighborhoods where the likelihood of an intermittent fault is less likely.

CMD 720 may be configured to obtain signals from branch 714 and signal IEDs 710 and 730 using a communication module 722 (such as a radio) as detailed herein, including a heartbeat signal and/or a loss-of-current signal. CMD 720 may be configured according to the embodiments described in conjunction with FIG. 5.

According to the above embodiment, when branch 714 experiences a fault at fault location F1, the CMD 720 will detect the fault condition and signal the IED 710. IED 710 can use this signal to determine its protection function. For example, IED 710 may receive the signal and open circuit breaker 708. IED 710 may use the signal from CMD 720 along with its own electric power system monitoring and protection functions to determine whether breaker 708 should be opened.

Furthermore, communications from CMD 720 may be received by IED 730. IED 730 may use the information from CMD 720 to inform its own protection algorithms. For example, IED 730 may use the heartbeat from CMD 720 to verify that branch 714 is receiving current. IED 730 may use a fault signal from CMD 720 to start a timer for IED 710 to clear the fault before IED 730 determines to open breaker 706 to clear the fault. Further still, IED 730 may use the heartbeat signal and/or the LOC condition signal from CMD 720 to perform fault location calculations. Indeed, IED 730 may be configured to calculate a distance to a fault and, when CMD 720 indicates a fault condition on branch 714, IED 730 may be configured to determine that the fault is present on branch 714 and not further down the line on feeder 704. Accordingly, transmissions from CMD 720 may be used by IEDs 710 and 730 to coordinate monitoring and protection actions, and in fault location determination.

Similarly, when a fault occurs at fault location F2, CMD 720 will not detect a fault condition, and will not signal IEDs 710 or 730 of a loss condition, but may instead continue to provide a heartbeat signal on schedule. Thus, IEDs 710 and 730 will rely on their fault detection modules to determine whether to open breaker 708. Furthermore, IED 730 may determine a fault location as being at F2, instead of at F1, due to the continuing heartbeat signal from CMD 720 and/or the absence of a loss-of-current signal from CMD 720. Additional CMDs may be used on feeder 704 and other branches to communicate with IEDs 710, 730, and the like, which signals may be used to determine a protective action, fault location, and the like.

Figure 7B:
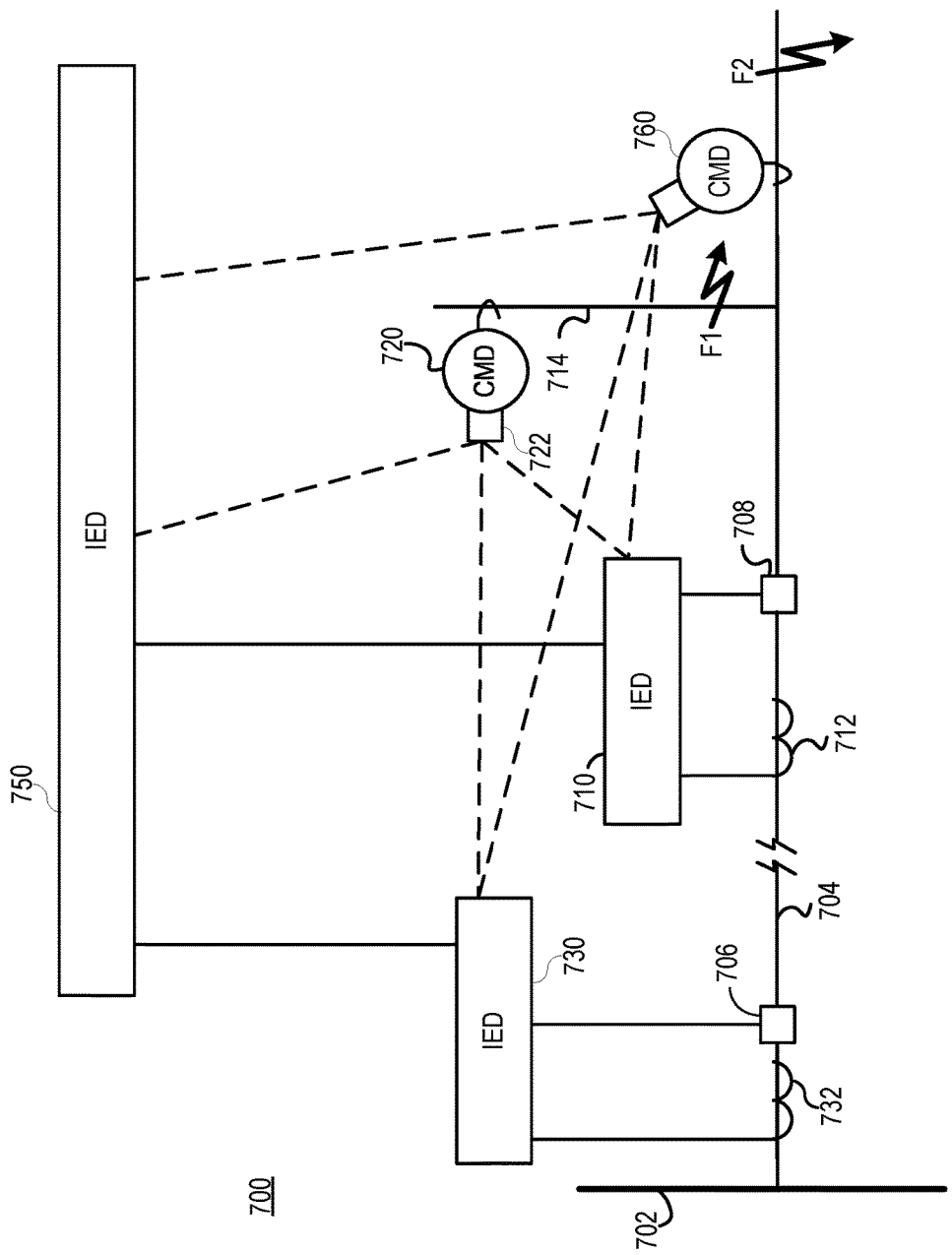
FIG. 7B illustrates an alternate configuration of the system illustrated in FIG. 7A consistent with embodiments of the present disclosure.

FIG. 7B illustrates an alternate configuration of the system 700 illustrated in FIG. 7A consistent with embodiments of the present disclosure. Similar to the embodiment illustrated and described in conjunction with FIG. 7A, the embodiment illustrated in FIG. 7B includes a bus 702, feeder 704, and branch 714 that are monitored and protected using IEDs 730 and 710. CMD 720 may be mounted on and in electrical communication with branch 714. CMD 760 may be mounted on and in communication with feeder 704 downline of the junction with branch 714. CMD 760 may be configured similarly to 720, to transmit a heartbeat signal and/or a signal indicating a fault such as loss-of-current or loss-of-voltage. Each IED 710 and 730 may be configured to receive the signals from CMD 720 and CMD 760. As indicated above, IEDs 710 and 730 may be configured to coordinate monitoring and protection functions using the communications from CMDs such as CMDs 720, 760, and calculate fault locations using communications from CMDs, such as CMDs 720, 760.

In one embodiment, IEDs 710, 730 may be configured to coordinate monitoring and protection functions and/or fault location calculation of fault F1 using a loss-of-current signal from 720 and the continued heartbeat signal (or lack of loss-of-current signal) from CMD 760 to determine that the fault is on branch 714, and to coordinate protection functions. For example, IED 730 may initiate a timer upon receipt of the LOC condition signal from CMD 720, to ensure that IED 710 opens breaker 708. That is, because IED 730 received the loss-of-current signal from CMD 720, IED 730 may be configured to conclude that the fault is on branch 714, and not between IED 730 and IED 710, so IED 710 should be allowed to clear the fault. Upon expiration of the timer, if the fault condition persists, then IED 730 may be configured to open breaker 706 to clear the fault.

Similarly, IEDs 710, 730 may be configured to coordinate monitoring and protection functions and/or fault location calculation of fault F2 using a loss-of-current signal from CMD 760 and the continued heartbeat signal (or lack of loss-of-current signal) from CMD 720 to determine that the fault is on feeder 704, and to coordinate protection functions. For example, IED 730 may initiate a timer upon receipt of the loss-of-current signal from CMD 760 to ensure that IED 710 opens breaker 708. That is, because IED 730 received the loss-of-current signal from CMD 760, IED 730 may be configured to conclude that the fault is further downline on feeder 704, and not between IED 730 and IED 710, so IED 710 should be allowed to clear the fault. Upon expiration of the timer, if the fault condition persists, then IED 730 may be configured to open breaker 706 to clear the fault.

Further, IED 750 may be configured to receive the signals from CMD 720 and CMD 760. IED 750 may be configured as an automation controller, such as a real-time automation controller, and be configured to coordinate protection, monitoring, and other functions of IEDs 710, 730. IED 750 may be in communication with IEDs 710, 730. Upon receipt of the signals from CMD 720 and 760, the IED 750 may be configured to coordinate actions of IEDs 710 and 730 as described above. Furthermore, IED 750 may be configured to translate the signals from CMDs 720, 760 into a format that is recognized by other IEDs such as IEDs 730, 710, or IEDs that are not in range of receiving communications from CMDs 720, 760. Accordingly, the communications from CMDs 720, 760 may be transmitted via IED 750 to IEDs 710, 730, or others.

In one particular embodiment, IED 710 may be a recloser control, and circuit breaker 708 may be a recloser. IED 710 may be configured to receive transmissions from CMD 720 on branch 714 as well as from CMD 760 on feeder 704. Upon detection of a fault condition, IED 710 may use the transmissions from CMD 720 and/or CMD 760 to modify its protection algorithms to better protect the electric power delivery system. For example, if the fault is at location F1, then CMD 720 may transmit a fault (or loss-of-current, or loss-of-voltage) message to IED 710, while CMD 760 does not transmit any fault, loss-of-current, or loss-of-voltage messages to IED 710. IED 710 may then delay an open command or trip command to recloser 708 to give time for local protection on branch 714 (such as a fuse, not separately illustrated) to operate. If the fault persists beyond the modified time, then IED 710 may trip recloser 708 to open. Furthermore, IED 710 may modify its reclosing scheme based on the communications from CMDs 720, 760. For example, upon opening recloser 708, if both CMD 720 and CMD 760 indicate a loss-of-current, then IED 710 may determine that a reclosing is warranted because the fault is not being fed by any other source. In various embodiments, reclosing schemes may be on a system with two possible sources, separated by an open recloser. In such systems, CMDs and recloser controls may be used according to the embodiments herein to determine the location of the fault, and further determine which reclosers should open and which should close in order to minimize the effects of the fault on the broader electric power delivery system. In one embodiment, many or all of the recloser controllers on such a system may obtain communications from many or all of the CMDs on the system such that each recloser controller is aware of the location of the fault, and can configure its recloser such that only the faulted section is isolated from the energy sources.

In another particular embodiment, an automation controller such as IED 750 may receive communications from various CMDs 720, 760 on an electric power delivery system. The automation controller 750 may perform various automation functions using the signals from the various CMDs 720, 760. For example, the automation controller may instruct IED 710 to shorten its time-overcurrent delay before tripping when a fault condition is indicated by the communications from CMD 760, and instruct IED 730 to delay a trip signal until after an attempted protection operation by IED 710.

In another embodiment, an automation controller such as IED 750 may receive communications from various CMDs 720, 760, and IEDs 710, 730 to coordinate electric power restoration efforts. For example, once a fault has been cleared, IED 750 may determine from signals from CMDs 720, 760 that power has not been restored to branch 714 or the downline location of CMD 760 on feeder 704. Further, IED 710 may also report an open condition of feeder 704 due to a lack of current thereon. Similarly, IED 730 may report an open recloser 706. Automation controller 750 may use this information to automate the order in which reclosers should be closed to best restore power to the system.

In another embodiment, an automation controller such as IED 750 may receive communications from various CMDs 720, 760 and IEDs 710, 730 to coordinate fault location. For example, if CMD 760 reports a fault condition but CMD 720 does not report a fault condition, then IED 750 may determine that the fault is found on feeder 704 downline of the junction with branch 714. Electric power system information from IED 710 may then be used to calculate a distance to the fault from IED 710 and properly locate the fault.

Further, the information from CMDs 720, 760 may be used to more accurately locate the fault. For example, if branch 714 exhibits an impedance profile that is different from the impedance profile of feeder 704, then the IED 750 may use such information in locating the fault. The information from CMD 720 indicating that the fault exists on branch 714, along with the electric power system measurements from IED 710 may be used to determine a fault location by applying the impedance profile from the IED 710 to the junction with the branch 714, and applying the impedance profile of the branch 714 to determine the accurate fault location.

In various embodiments, IED 750 may use information from both IEDs 710, 730 and CMDs 720, 760 to verify information. For example, fault information from IED 710 may be used to verify fault information from IED 730; both of which may be checked against fault information from CMDs 720 and 760.

Figure 8:
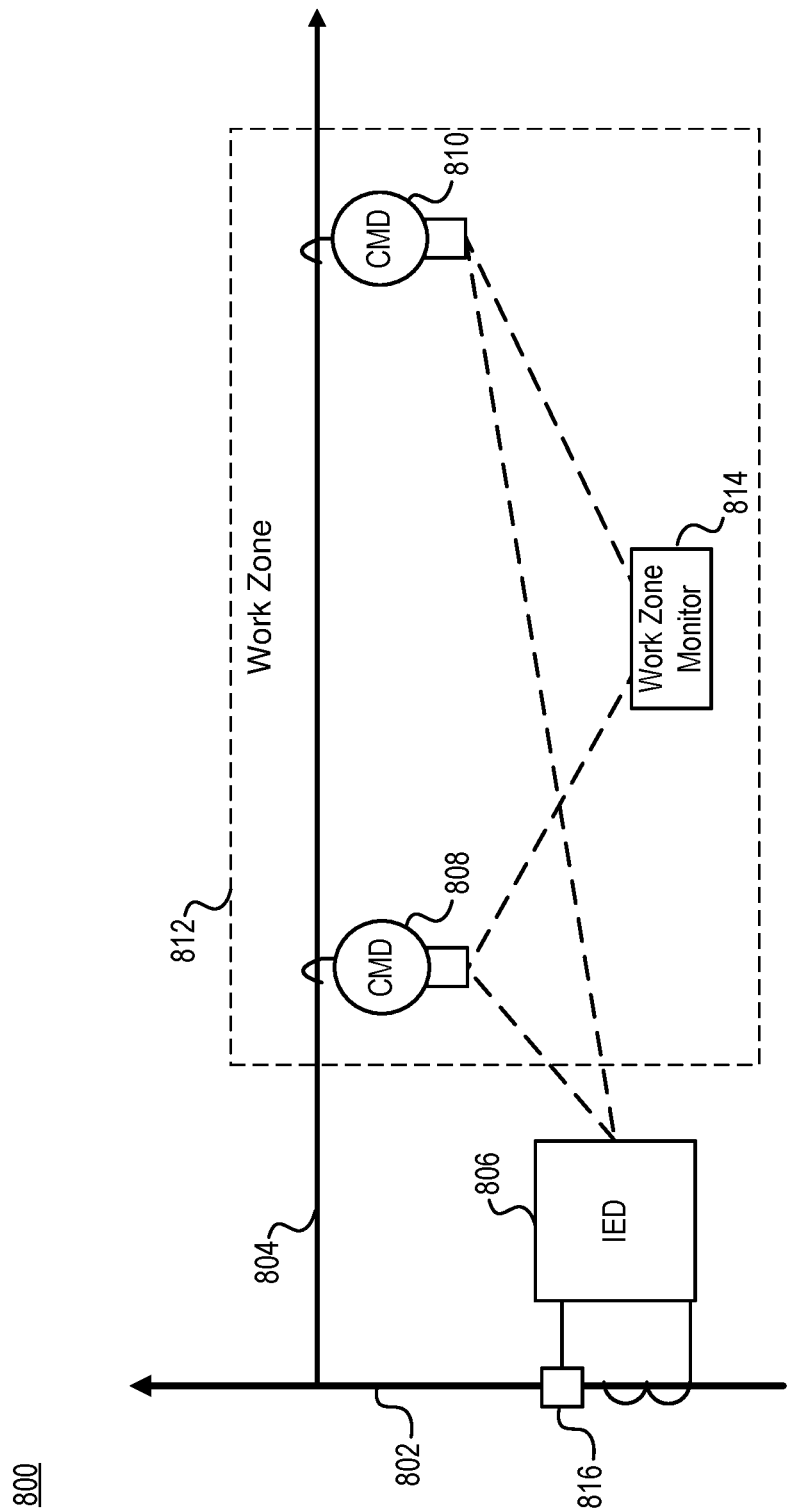
FIG. 8 illustrates a system comprising a plurality of CMDs placed around a work zone consistent with embodiments of the present disclosure.

FIG. 8 illustrates a system 800 comprising a plurality of CMDs placed around a work zone 812 consistent with embodiments of the present disclosure. System 800 comprises a feeder 802 monitored by an IED 806. A current transformer may be used to monitor electrical current flowing through feeder 802. A breaker 816 may be opened to de-energize the work zone while work is performed on branch 804, which may be in electrical communication with feeder 802.

CMDs 808 and 810 may be temporarily positioned on branch 804 while work is performed to monitor the flow of electrical current through branch 804. In the event that current is detected in branch 804, a signal may be sent to IED 806 and/or to a work zone monitor 814. The signal may be used as a failsafe to ensure that breaker 816 is not inadvertently closed, thus re-energizing branch 804. In the event that the breaker is closed, the signal may cause the breaker to immediately open and de-energize branch 804. In some circumstances, branch 804 may be re-energized inadvertently or by a distributed generation source located on feeder 804.

A work zone monitor 814 may be present in the work zone to receive signals from CMD 808 and CMD 810. The work zone monitor 814 may provide an on-site warning that branch 804 has been re-energized. In various embodiments, the warning may comprise an alarm configured to alert workers to the dangerous conditions created by electrical energy flowing through feeder 804.

Figure 9:
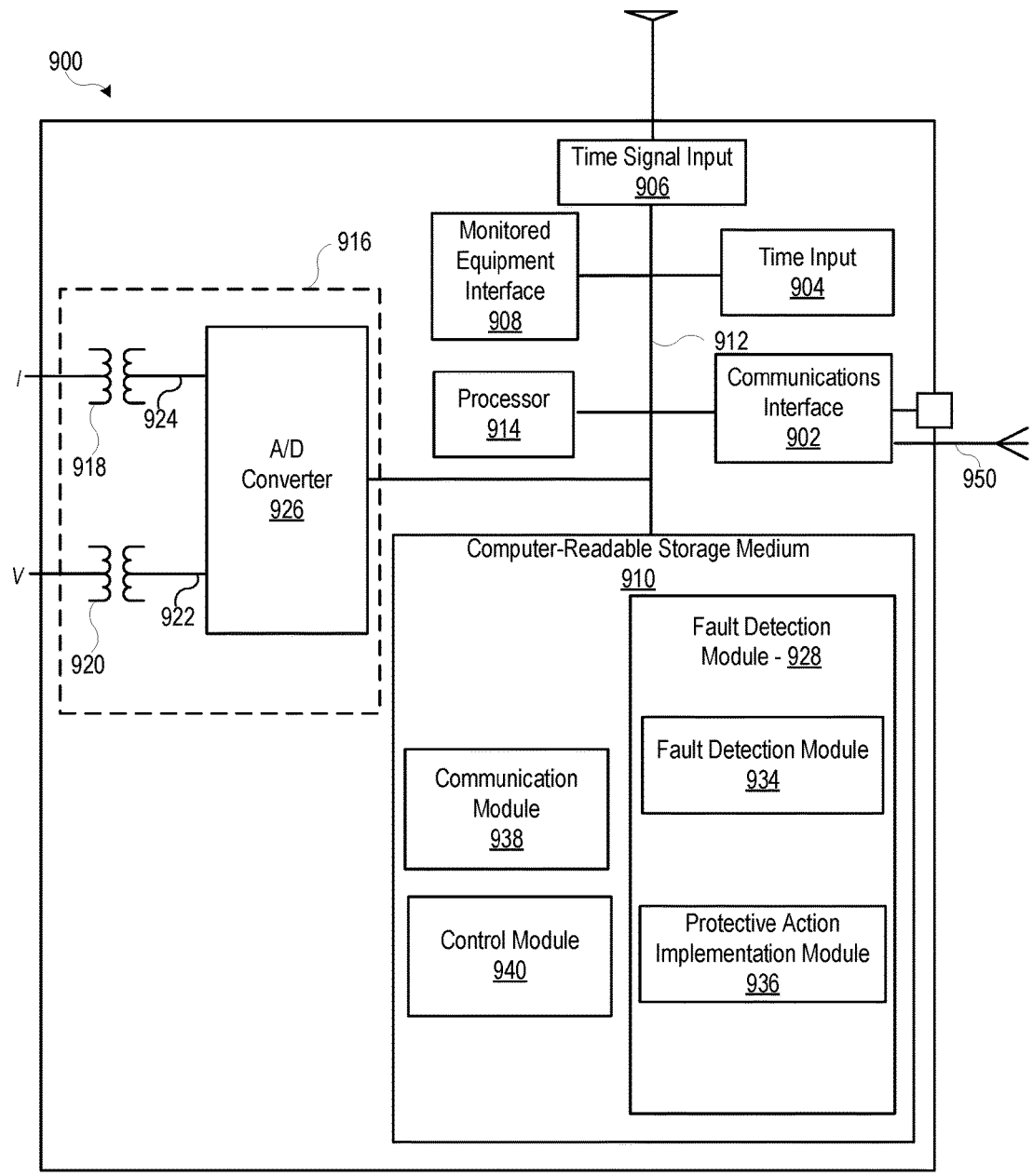
FIG. 9 illustrates a functional block diagram of an intelligent electronic device consistent with embodiments of the present disclosure.

FIG. 9 illustrates a block diagram of an IED 900 consistent with embodiments disclosed herein. Embodiments of the IED 900 may be utilized to implement embodiments of the systems and methods disclosed herein. Any of IEDs 710, 730, or 750 from FIG. 8 may be embodied similarly to the block diagram of IED 900. For example, the IED 900 may be configured to receive communications from various CMDs and use such communications in its monitoring and protection of the electric power delivery system. The IED 900 may also be configured to coordinate its actions and/or the actions of one or more other IEDs based, at least in part, on information provided by the other IEDs and the CMDs.

IED 900 may include a communications interface 902 configured to communicate with a communication network. The communications interface 902 may include a separate communications interface to communicate with one or more CMDs, to receive signals therefrom related to current flowing through conductors on one or more phases or sections of the electric power delivery system. Such communications interface may include an antenna 950 for receiving signals from a CMD. IED 900 may also include a time input 904, which may be used to receive a time signal. In certain embodiments, a common time reference may be received via communications interface 902, and accordingly, a separate time input 904 and/or Global Navigation Satellite System (GNSS) time input 906 may not be necessary. One such embodiment may employ the IEEE 1588 protocol.

A monitored equipment interface 908 may be configured to receive equipment status information from, and issue control instructions to, a piece of monitored equipment, such as an electrical generator, breaker, voltage regulator controller, and/or the like. According to certain embodiments, the monitored equipment interface 908 may be configured to interface with a variety of equipment of an electric power delivery system. In certain embodiments, the equipment status information and/or control instructions may be communicated over the communications interface 902.

A computer-readable storage medium 910 may be the repository of one or more modules and/or computer-executable instructions configured to implement any of the processes described herein. A data bus 912 may link monitored equipment interface 908, time input 904, communications interface 902, time signal input 906, and the computer-readable storage medium 910 to a processor 914.

Processor 914 may be configured to process communications received via communications interface 902, time input 904, time signal input 906, and/or monitored equipment interface 908. Processor 914 may operate using any number of processing rates and architectures. Processor 914 may be configured to perform various algorithms and calculations described herein using computer-executable instructions stored on computer-readable storage medium 910. Processor 914 may be embodied as a general-purpose integrated circuit, an application-specific integrated circuit, a field-programmable gate array, and/or other programmable logic devices.

In certain embodiments, IED 900 may include a sensor component 916. In the illustrated embodiment, sensor component 916 is configured to gather data from a location of the electric power delivery system (not shown) using a current transformer 918 and/or a voltage transformer 920. Voltage transformer 920 may be configured to step-down the power system's voltage (V) to a secondary voltage waveform 922 having a magnitude that can be readily monitored and measured by IED 900. Similarly, current transformer 918 may be configured to proportionally step-down the power system's line current (I) to a secondary current waveform 924 having a magnitude that can be readily monitored and measured by IED 900. Although not separately illustrated, the voltage and current signals V and I may be secondary signals obtained from equipment instruments designed to obtain signals from power system equipment. For example, a secondary voltage signal V may be obtained from a potential transformer (PT) in electrical communication with a conductor. A secondary current signal I may be obtained from a current transformer (CT) in electrical communication with a conductor. Various other instruments may be used to obtain signals from electric power delivery systems including, for example, Rogowski coils, optical transformers, and the like.

An analog-to-digital converter 926 may multiplex, sample and/or digitize the measured voltage and/or current signals to form corresponding digitized current and voltage signals. Similar values may also be received from other distributed controllers, station controllers, regional controllers, or centralized controllers. The values may be in a digital format or other format. In certain embodiments, sensor component 916 may be utilized to monitor current signals associated with portions of an electric power delivery system and/or detect inter-harmonic content associate with high-impedance fault (HIF) events included in such monitored current signals. Further, sensor component 916 may be configured to monitor a wide range of characteristics associated with monitored equipment, including equipment status, temperature, frequency, pressure, density, infrared absorption, radio-frequency information, partial pressures, viscosity, speed, rotational velocity, mass, switch status, valve status, circuit breaker status, tap status, meter readings, and the like.

A/D converter 926 may be connected to processor 914 by way of a bus 912, through which digitized representations of current and voltage signals may be transmitted to processor 914. As described above, processor 914 may be used to apply equipment status, measurements, and derived values to an IED module. Processor 914 may be used to detect the occurrence of HIF conditions and issue control instructions in response to the same (e.g., instructions implementing protective actions).

In some embodiments, a separate device may be used in place of a sensor component 916 for providing signals from the electric power delivery system to the IED 900. Indeed, a separate device may be configured to obtain signals from the electric power delivery system (such as voltage and/or current signals), create digitized representations of the signals (for example current and voltage signals), apply a time stamp, and/or supply such information to the IED 900. Further, the separate device may be configured to supply equipment status and/or measurements such as voltage and/or current magnitudes and/or angles along with time stamps to the IED 900. In certain embodiments, the information that has been described as received from sensor component 916 is instead received from communications interface 902.

A monitored equipment interface 908 may be configured to receive status information from, and issue control instructions to, a piece of monitored equipment. Monitored equipment interface 908 may be configured to issue control instructions to one or more pieces of monitored equipment. According to some embodiments, control instructions may also be issued via communications interface 902. Control instructions issued via communications interface 902 may be transmitted, for example, to other distributed controllers, coordination controllers, IEDs, or the like (not shown), which in turn may issue the control instruction to a piece of monitored equipment. Alternatively, the piece of monitored equipment may receive the control instruction directly via its own communications interface.

Computer-readable storage medium 910 may be the repository of one or more modules and/or executable instructions configured to implement certain functions and/or methods described herein. For example, computer-readable storage medium 910 may include a fault detection module 928, which may be a repository of the modules and/or executable instructions configured to implement the HIF detection and protection functionalities described herein. The fault detection module 928 may include, among others, a fault detection module 934 and a protective action implementation module 936. The computer-readable medium 910 may further include a communication module 938 and a control module 940.

Fault detection module 928 may be configured to receive signals obtained using antenna 950 from CMDs in communication with the IED 900. As described above, the signals may include a heartbeat signal and/or a fault detection signal. The fault detection module 928 may be configured to expect a heartbeat signal on a predetermined schedule, and alarm when the heartbeat signal is not received.

The fault detection module 928 may further be configured to use a fault detection signal received using antenna 950 from a CMD in its protection algorithms. The fault detection signal may be used to coordinate operations of the IED 900. In one embodiment, the fault detection signal may be used to issue a protective command such as opening a circuit breaker. In another embodiment, the fault detection signal may be used in combination with another fault detection signal such as a high-impedance fault signal, overcurrent signal, under-voltage signal, balance signal, or the like derived from the electric power system by IED 900.

Fault detection module 934 may be configured to perform certain fault detection functions described herein. In certain embodiments, the fault detection module 934 may be configured to identify the occurrence of a fault or other event based on current signal information or voltage signal information that may be provided, for example, by the sensor component 916.

Upon determining a fault event, an indication from the fault detection module 934 may be used by the protective action implementation module 936 and may implement one or more protective actions to mitigate potentially unsafe conditions and damage to an electric power delivery system (e.g., issuing control instructions to trip a breaker and isolate the fault from the system).

Additionally, the protective action implementation module 936 may be configured to use information from various CMDs to modify its protective actions, according to various embodiments described herein.

A control module 940 may be configured for interacting with monitored equipment connected to a distributed controller via monitored equipment interface 908 and/or via communications interface 902. According to some embodiments, control instructions from the control module 940 may be intended as control instructions for other IEDs and/or monitored equipment located remotely to IED 900. In some cases, control instructions may be only informative or suggestive, meaning that the receiving IED is not obligated to perform the control instruction. Rather, the receiving IED may use the suggested control instruction in coordination with its own determinations and information from other controllers to determine whether it will perform the control instruction. In other cases, control instructions may be directive in that they are required actions. Differentiation between informative or suggestive control instructions and mandatory control instruction may be based on information included with the control instruction.

A communication module 938 may include instructions for facilitating communication of information from IED 900 to other controllers and/or other components in the electric power delivery system. The communication module 938 may include instructions on the formatting of communications according to a predetermined protocol. Communication module 938 may be configured with subscribers to certain information, and may format message headers according to such subscription information.

Figure 10:
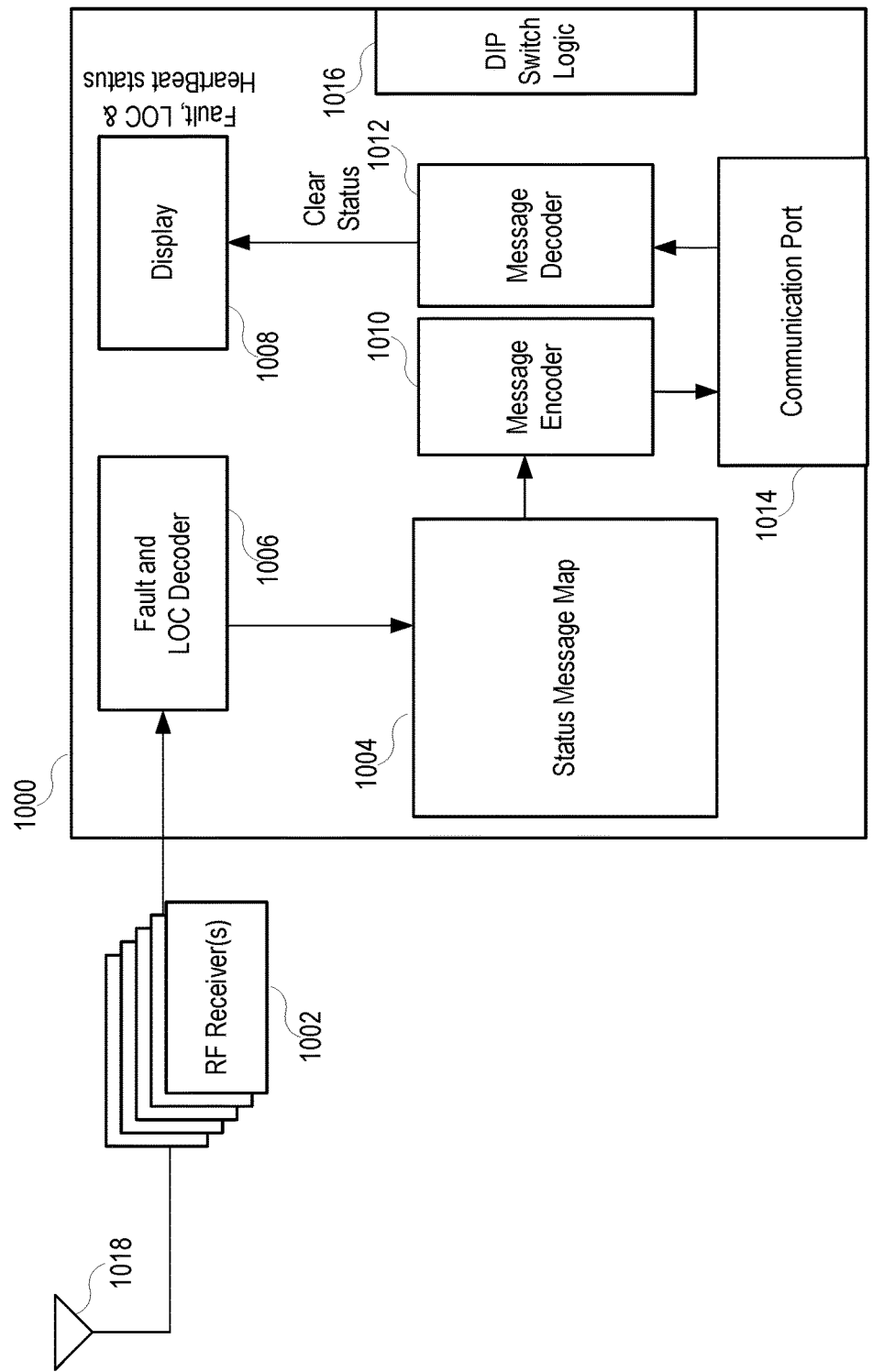
FIG. 10 illustrates a functional block diagram of a receiver device configured to communicate with a plurality of CMDs consistent with embodiments of the present disclosure.

FIG. 10 illustrates a functional block diagram of a receiver device 1000 configured to communicate with a plurality of CMDs consistent with embodiments of the present disclosure. In certain embodiments, receiver device 1000 may be added to an existing system to increase the ability to locate faults and/or LOC conditions. An antenna 1018 may be in communication with one or more RF receivers 1002, each of which may be in communication with one or more CMDs. The RF receivers 1002 may differentiate between the multiple CMDs based on, for example, an address embedded in the communication, a radio frequency, or the like. A fault and LOC decoder 1006 may be configured to decode fault and LOC condition messages from RF receivers 1002. In some embodiments, the fault and LOC decoder 1006 may comprise logic to detect and correct errors due to noise in the wireless channel. A status message map 1004 may be configured to map the location of any fault or LOC condition messages. Receiver device 1000 may include a map or other indication of the location of a plurality of CMDs in an electric power delivery system. The map may provide an indication of the location of a fault to facilitate repair and/or to identify areas of the electric power delivery system affected by a LOC condition.

A message encoder 1010 may be configured to encode messages to be transmitted to an IED via a communication port 1014. The message encoder 1010 may generate data packets configured for delivery to an IED or other device operable to implement a control action based on a fault. In various embodiments, communication port 1014 may comprise an Ethernet port, a serial port, a USB port, etc. A message decoder 1012 may be configured to receive messages from the communication port 1014. In some embodiments, a message decoder 1012 may receive messages relating to fault status, LOC conditions, and heartbeat signals. Information based on such messages may be provided on a display 1008. In various embodiments, the display may comprise a text or graphical display, a plurality of LEDs, or any other form of human-machine interface device.

DIP switch logic 1016 may be used to configure to communication settings associated with receiver device 1000. In some embodiments, the DIP switch logic 1016 may be used to identify CMDs on a network. In other embodiments, the DIP switch logic 1016 may be used to configure the speed of the communication port 1014. Still further, the DIP switch logic 1016 may be used to set a gain parameter associated with the RF receivers 1002.

Figure 11:
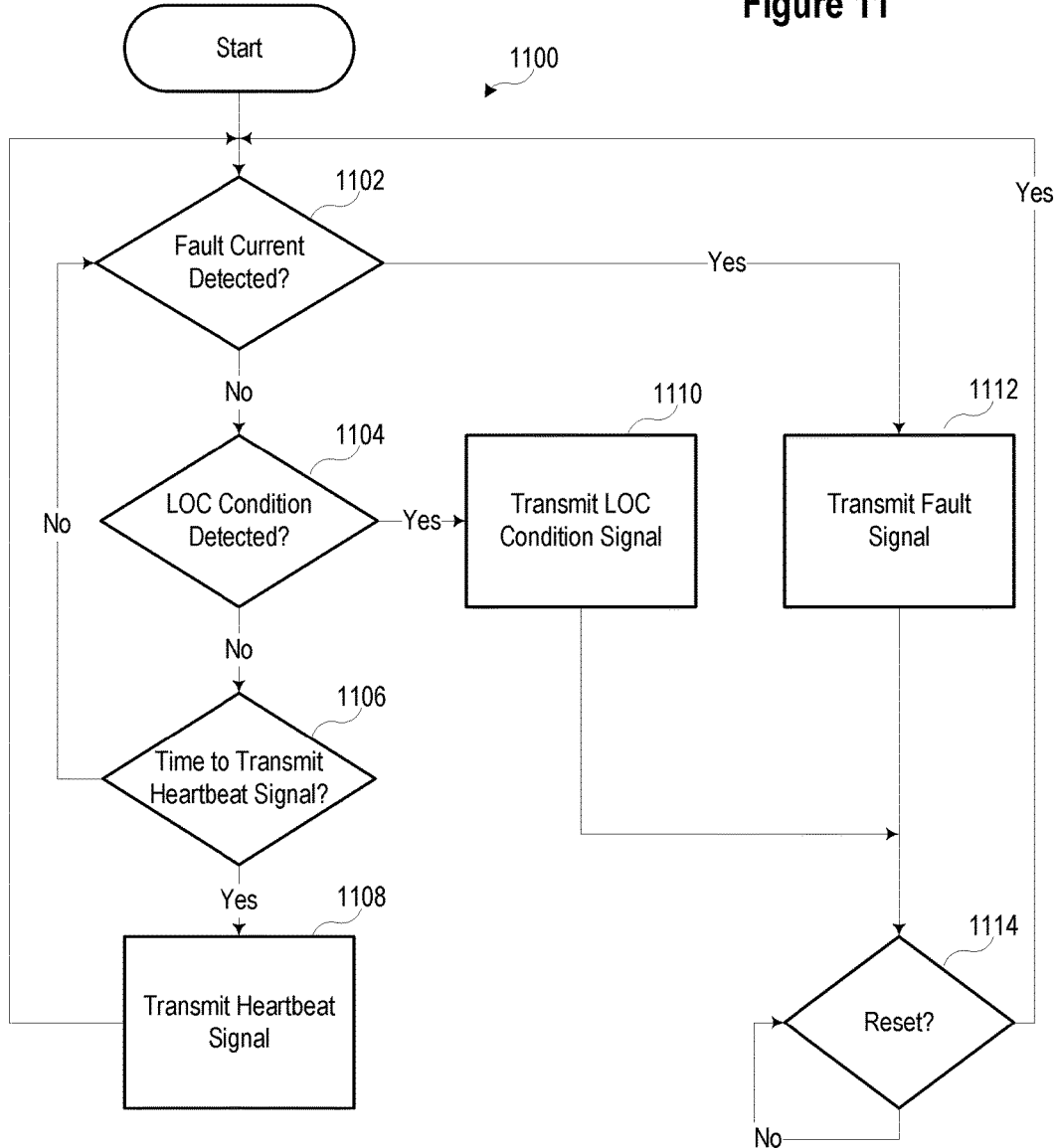
FIG. 11 illustrates a flow chart of a method of operating a CMD consistent with the present disclosure.

FIG. 11 illustrates a flowchart of a method 1100 of operating a CMD consistent with the present disclosure. At 1102, a CMD implementing method 1100 may determine if a fault current has been detected. Upon detection of a fault current, a fault signal may be transmitted at 1112. In some embodiments, such as the embodiment illustrated in FIG. 4B, a visual indicator of the fault current may also be activated. At 1104, the CMD may determine whether a LOC condition has been detected. If a LOC condition is detected, a LOC condition signal may be transmitted at 1110. Following transmission of either the LOC condition signal at 1110 or transmission of the fault signal at 1112, the CMD may await a reset signal at 1114. In some embodiments, the reset signal may enable the resumption of the flow of electrical current through a conductor monitored by a CMD implementing method 1100. At 1106, method 1100 may determine whether it is time to transmit a heartbeat signal. In various embodiments, the heartbeat signal may be transmitted according to a specific schedule. The heartbeat signal may be transmitted at 1108.

Figure 12:
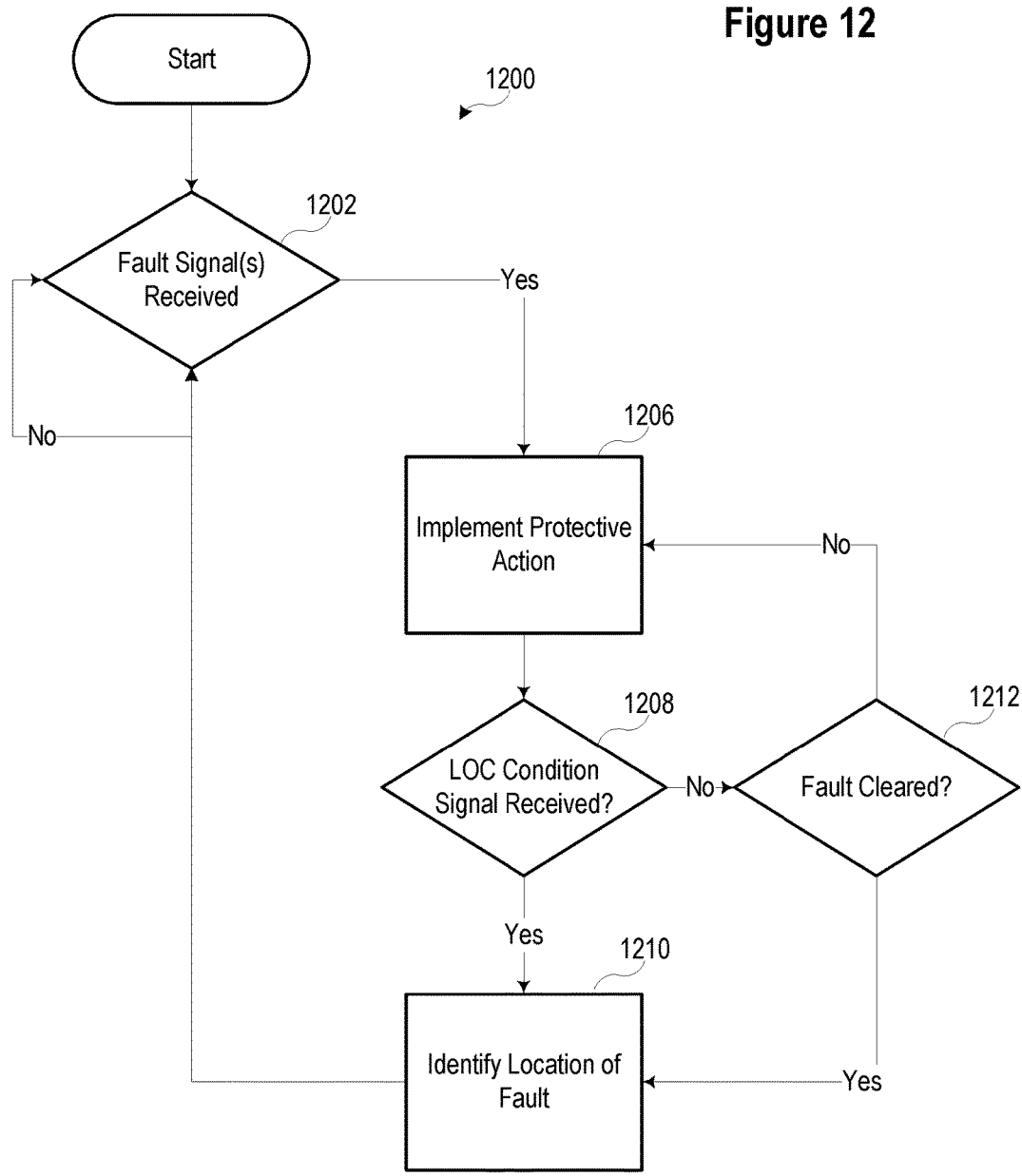
FIG. 12 illustrates a flow chart of a method of detecting a fault, verifying that a fault has been cleared by a protective action, and locating the fault using signals from one or more CMDs consistent with the present disclosure.

FIG. 12 illustrates a flow chart of a method 1200 of detecting a fault, verifying that a fault has been cleared by a protective action, and locating the fault using signals from one or more CMDs consistent with the present disclosure. In various embodiments, method 1200 may be implemented by a control system configured to receive signals from one or more CMDs. At 1202, method 1200 may determine whether one or more fault signals have been received. If not, method 1200 may remain at 1202 until a fault signal is received. At 1206, a protective action may be implemented in response to the fault condition. In various embodiments, the protective action may include interrupting the flow of electrical current in an area of the electric power system affected by the fault.

At 1208, method 1200 may determine whether a LOC condition signal has been received. The detection of a LOC condition may be expected based on the protective action implemented at 1206. If a LOC condition is not detected following the protective action, the protective action may not have cleared the fault at 1212, and method 1200 may implement additional protective actions. Once the fault has been cleared at 1212 and/or a LOC condition signal has been received at 1208, a fault location may be determined at 1210.

As discussed above, the location of the fault may be determined based on a path of the fault current through the electric power system, the location of one or more CMDs that detected the fault current, and the topology of the electric power system.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may not include long-distance transmission of high-voltage power. Moreover, principles described herein may also be utilized for protecting an electrical system from over-frequency conditions, wherein power generation would be shed rather than load to reduce effects on the system. Accordingly, many changes may be made to the details of the above-described embodiments without departing from the underlying principles of this disclosure. The scope of the present invention should, therefore, be determined only by the following claims.

What is claimed is:

1. A system for monitoring and protecting an electric power delivery system, the system comprising:
    a plurality of conductor-mounted detectors (CMDs) configured to couple to an electrical conductor, each CMD comprising:
        a power harvesting subsystem configured to harvest power from the electrical conductor;
        a current monitor subsystem configured to monitor an electrical current in the conductor;
        a fault detection subsystem configured to determine when the electrical current in the conductor exceeds a fault current threshold; and
        a transmission subsystem configured to transmit a fault signal upon detection of the fault current threshold;
    a receiver in communication with each of the plurality of CMDs and configured to receive the fault signal from at least one of the plurality of CMDs; and
    a protective action subsystem in communication with the receiver, the protective action subsystem configured to:
        identify each of the plurality of CMDs to transmit the fault signal;
        determine a protective action based on each of the plurality of CMDs to transmit the fault signal to minimize an area of the electric power system to clear the fault; and
        implement the protective action.

2. The system of claim 1, wherein the transmission subsystem of each of the plurality of CMDs comprises a wireless transmission subsystem.

3. The system of claim 1, wherein each of the plurality of CMDs further comprises a heartbeat subsystem configured to transmit a heartbeat signal via the transmission subsystem according to a schedule;
    wherein a receiver is further configured to:
        detect an interruption in the schedule of the heartbeat signal from at least one of the plurality of CMDs; and
        to identify a location of the fault based on the interruption in the schedule and the fault signal.

4. The system of claim 1, wherein the transmission subsystem of each of the plurality of CMDs is further configured to transmit a unique identifier.

5. The system of claim 1, wherein each of the plurality of CMDs further comprises a capacitor configured to store power sufficient to send the fault signal when the conductor is de-energized.

6. The system of claim 1, wherein each of the plurality of CMDs further comprises a display component configured to display an indication of the fault.

7. The system of claim 1, wherein the protective action subsystem is further configured to determine that the fault occurred on an unfused line; and
wherein the protective action comprises activation of a breaker before a delay associated with a fuse curve.

8. The system of claim 1, wherein the protective action subsystem is further configured to determine that the fault occurred on a fused line; and
wherein implementation of the protective action comprises a delay in activation of a breaker for longer than a delay associated with a fuse curve.

9. The system of claim 1, wherein the fault current threshold comprises a variable threshold based on the electrical current in the conductor.

10. The system of claim 1, wherein each of the plurality of CMDs further comprises a loss-of-current (LOC) condition detection subsystem; and
the transmission subsystem is further configured to transmit a LOC condition signal upon detection of the LOC condition.

11. The system of claim 1, wherein the receiver and the protective action subsystem are comprised in an intelligent electric device.

12. The system of claim 1, wherein the protective action subsystem is further configured to receive confirmation of the fault independent from the fault signal received from at least one of the plurality of CMDs prior to implementation of the protective action.

13. A method for monitoring and protecting an electric power delivery system, the method comprising:
mounting a plurality of conductor-mounted detectors (CMDs) to a plurality of electrical conductors, each of the plurality of CMDs:
harvesting power from the electrical conductor;
monitoring an electrical current in the conductor;
determining that the electrical current in the conductor exceeds a fault current threshold; and
transmitting a fault signal when the electrical current in the conductor exceeds a fault current threshold;
receiving the fault signal from at least one of the plurality of CMDs;
identifying each of the plurality of CMDs to transmit the fault signal;
determining a protective action based on each of the plurality of CMDs to transmit the fault signal to minimize an area of the electric power system to clear the fault; and
implementing the protective action.

14. The method of claim 13, wherein transmitting a fault signal comprises a wireless transmission.

15. The method of claim 13, further comprising:
each of the plurality of CMDs transmitting a heartbeat signal via the transmission subsystem according to a schedule;
detecting an interruption in the schedule of the heartbeat signal from at least one of the plurality of CMDs; and
identifying a location of the fault based on the interruption in the schedule and the fault signal.

16. The method of claim 13, further comprising each of the plurality of CMDs transmitting a unique identifier.

17. The method of claim 13, further comprising each of the plurality of CMDs storing power sufficient to send the fault signal when the conductor is de-energized in a capacitor.

18. The method of claim 13, further comprising displaying an indication of the fault on a display component on each of the plurality of CMDs to transmit the fault signal.

19. The method of claim 13, further comprising:
determining that the fault occurred on an unfused line; and
wherein the protective action comprises activating a breaker before a delay associated with a fuse curve.

20. The method of claim 13, further comprising:
determining that the fault occurred on a fused line; and
wherein the protective action comprises delaying activation of a breaker for longer than a delay associated with a fuse curve.

21. The method of claim 13, wherein the fault current threshold comprises a variable threshold based on the electrical current in the conductor.

22. The method of claim 13, further comprising:
detecting a loss-of-current (LOC) condition; and
transmitting a LOC condition signal upon detection of the LOC condition.

23. The method of claim 13, further comprising receiving confirmation of the fault independent from the fault signal received from at least one of the plurality of CMDs prior to implementing the protective action.

24. A system for monitoring and protecting a work zone in an electric power delivery system, the system comprising:
a plurality of conductor-mounted detectors (CMDs) configured to couple to an electrical conductor, each CMD comprising:
a current monitor subsystem configured to monitor an electrical current in the conductor and to identify a change in the electrical current in the conductor; and
a transmission subsystem configured to transmit an alert signal based on the change in the electrical current in the conductor;
a receiver in communication with each of the plurality of CMDs and configured to receive the alert fault signal from at least one of the plurality of CMDs; and
a protective action subsystem in communication with the receiver, the protective action subsystem configured to:
generate a protective action based on each of the plurality of CMDs to transmit the alert signal to counteract the change; and
implement the protective action.

25. A method for monitoring and protecting a work zone in an electric power delivery system, the method comprising:
mounting a plurality of conductor-mounted detectors (CMDs) to a plurality of electrical conductors around a work zone, each of the plurality of CMDs:
monitoring an electrical current in the conductor;
identifying a change in the electrical current in the conductor; and
transmitting an alert signal based on the change in the electrical current in the conductor;
receiving the alert signal from at least one of the plurality of CMDs;
identifying each of the plurality of CMDs to transmit the alert signal;
generating a protective action based on each of the plurality of CMDs to transmit the alert signal to counteract the change; and
implementing the protective action.

* * * * *